(12) United States Patent
Hasegawa

(10) Patent No.: US 7,915,812 B2
(45) Date of Patent: Mar. 29, 2011

(54) ORGANIC LIGHT-EMITTING DEVICE AND DISPLAY APPARATUS

(75) Inventor: Toshinori Hasegawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 116 days.

(21) Appl. No.: 12/392,459

(22) Filed: Feb. 25, 2009

(65) Prior Publication Data
US 2009/0212692 A1  Aug. 27, 2009

(30) Foreign Application Priority Data

Feb. 27, 2008 (JP) ................. 2008-046240
Feb. 18, 2009 (JP) ................. 2009-035625

(51) Int. Cl.
*H05B 33/00* (2006.01)
*H01J 1/62* (2006.01)

(52) U.S. Cl. ........................ 313/504; 313/506
(58) Field of Classification Search .......... 313/504–512; 428/690; 445/23–25
See application file for complete search history.

(56) References Cited

U.S. PATENT DOCUMENTS

| | | | |
|---|---|---|---|
| 2005/0280364 A1 | 12/2005 | Omura et al. | 313/506 |
| 2007/0029539 A1 | 2/2007 | Yashima et al. | 257/13 |
| 2007/0252520 A1 | 11/2007 | Hasegawa | 313/504 |
| 2008/0143649 A1 | 6/2008 | Asaki et al. | 345/76 |

FOREIGN PATENT DOCUMENTS

| | | |
|---|---|---|
| JP | 2006-032327 | 2/2006 |
| JP | 2007-234581 | 9/2007 |

*Primary Examiner* — Joseph L Williams
(74) *Attorney, Agent, or Firm* — Fitzpatrick, Cella, Harper & Scinto

(57) ABSTRACT

Provided are an organic light-emitting device that has wide viewing angle characteristics and enables excellent color reproduction, and a display apparatus including the organic light-emitting device. In the device, an optical path between a first reflective surface formed on the first electrode side with respect to an emission layer and a second reflective surface formed on a second electrode side with respect to the emission layer are set so as to resonate light emitted in the emission layer, and a first region with a relatively short optical path $L_1$ and a second region with a relatively long optical path $L_2$ are provided, wherein $L_1$ and $L_2$ are set to satisfy Expression 1 with resonant wavelengths $\lambda_1$, $\lambda_2$, and $\lambda_3$, a sum $\phi t$ of phase shifts when light is reflected by the first reflective surface and the second reflective surface, and a viewing angle $\alpha$:

$$\lambda_1 = 2L_1/(p - \phi t/2\pi)$$

$$\lambda_2 = 2L_2/(q + 1 - \phi t/2\pi)$$

$$\lambda_3 = 2L_2 \cos \alpha/(q - \phi t/2\pi)$$

$$\lambda_1 = \lambda_2 = \lambda_3 \qquad \text{(Expression 1)}$$

wherein p and q each independently represent a positive integer and $\alpha$ is not 0°.

12 Claims, 11 Drawing Sheets

ORGANIC LIGHT-EMITTING DEVICE AND DISPLAY APPARATUS

BACKGROUND OF THE INVENTION

1. Field of the Invention

The present invention relates to a light-emitting device using an organic compound and a display apparatus using the light-emitting device. More specifically, the present invention relates to an organic light-emitting device that emits light when an electric field is applied to a thin film including an organic compound, and a display apparatus using the organic light-emitting device.

2. Description of the Related Art

An organic light-emitting device (organic electroluminescence (EL) device; hereinafter, sometimes simply referred to as "device") has been extensively researched and developed. Such an organic light-emitting device includes a pair of electrodes consisting of an anode and a cathode, and a plurality of organic compound layers including a light-emitting layer (hereinafter, simply referred to as "emission layer") formed between the pair of electrodes. The organic compound layers each have a film thickness of about several tens of nanometers, and one of the electrodes reflects light. The other electrode functions as a light extraction electrode, and reflects a part of emitted light at an interface thereof with an external environment. Thus, an optical interference effect is developed remarkably in which light with a particular wavelength is resonated to be enhanced in an organic light-emitting device.

FIG. 1 is a schematic cross-sectional view of an ordinary organic light-emitting device. In FIG. 1, the organic light-emitting device includes a substrate 1, and a reflective layer 2, a transparent conductive layer (anode) 3, a hole-transporting layer 4, an emission layer 5, an electron-transporting layer 6, an electron injection layer 7, a semi-transmissive layer 8, a transparent electrode (cathode) 9 provided in the mentioned order on the substrate 1. Holes injected from the anode and electrons injected from the cathode are recombined in the emission layer by allowing a current to flow through the EL device, whereby light is emitted.

In such an organic light-emitting device, a resonator structure is constituted between the reflective layer 2 on the substrate and the semi-transmissive layer 8. Here, an optical path between the reflective layer 2 and the reflective interface of the semi-transmissive layer 8 is represented by L, a resonant wavelength is represented by $\lambda$, and an angle at which light emission from the device is recognized visually is represented by $\theta$ (it is assumed that the angle at which the light emission is recognized visually in front of the device, namely when recognized visually in a direction perpendicular to a light extraction surface of the device is defined as 0°). Further, in the case where the sum of phase shifts when emitted light is reflected by the upper and the lower electrodes is represented by $\phi$ (rad), and the order of optical interference is represented by m, when there is a relationship satisfying Equation 1 between the respective parameters, emission enhancement by resonance can be utilized.

That is, by bringing the peak wavelength of the emission spectrum (PL spectrum) generated by photoexcitation of the emission layer into conformity with the resonant wavelength, the intensity of the peak wavelength of the emission spectrum can be enhanced. Hereinafter, for differentiation from the PL spectrum, the emission spectrum taken out from the device is refereed to as "EL spectrum".

$$\lambda = 2L \cos\theta/(m - \phi t/2\pi) \quad \text{(Equation 1)}$$

wherein m represents a positive integer.

Incidentally, when emitted light is actually reflected by the respective electrodes, the sum of phase shifts $\phi t$ varies depending upon the combination of an electrode material and an organic material constituting the reflective interface.

It can be seen from Equation 1 that the enhancement peak wavelength (resonant wavelength) $\lambda$ varies depending upon the optical path L. Furthermore, when the angle (viewing angle) $\theta$ at which light emission is recognized visually with respect to the device increases, the cos $\theta$ value decreases, and the resonant wavelength $\lambda$ is shifted to a shorter wavelength side. Therefore, in the case where the viewing angle is increased when the device having the optical path L is viewed, the resonant wavelength is displaced from the peak wavelength of the emission spectrum of the emission layer (PL spectrum), and the peak wavelength of the emission spectrum is not enhanced and further, is weakened. As a result, as the viewing angle increases, the emitted light looks darker.

Further, in the case where the viewing angle is increased, the resonant wavelength $\lambda$ is shifted (blue shift) to a shorter wavelength side along with the decrease in the cos $\theta$ value, whereby the color of light emitted from the light-emitting device looks different, which is a problem.

The above-mentioned problem also applies to the case where the light-emitting devices are used as pixels of a display apparatus. Specifically, the above-mentioned problem also applies to the case of a display apparatus having a plurality of pixels with different emission colors (e.g., red, green, blue) as a pixel unit. In the case of such a display apparatus, there is another problem that the balance of a mixed color may be varied due to the change in color of each pixel when viewed obliquely. That is, when a light-emitting device that exhibits a red color in front thereof (namely, in a direction perpendicular to a light extraction surface of the device) is viewed obliquely, the light-emitting device exhibits an orange color. When a light-emitting device that exhibits a green color in front thereof is viewed obliquely, the light-emitting device exhibits a blue color. When a light-emitting device that exhibits a blue color in front thereof is viewed obliquely, the light-emitting device exhibits a darker blue color. Therefore, the white color (white balance) expressed by the color mixing of red, green, and blue is impaired.

Japanese Patent Application Laid-Open No. 2006-32327 discloses a light-emitting device in which portions having different optical paths are provided in one light-emitting device, and light emissions having different viewing angle characteristics are combined, whereby the change in characteristics depending upon the viewing angle is averaged and alleviated. This patent document discloses a device in which the optical path in the light-emitting device is changed, for example, a green-light-emitting device in which the resonant wavelength and the order at a viewing angle of 0° are each set to be 510 nm/m=2 and 570 nm/m=1.

Furthermore, Japanese Patent Application Laid-Open No. 2007-234581 discloses a light-emitting device and a display apparatus in which a plurality of portions with different optical paths are provided in one light-emitting device and between adjacent pixels having the same emission color, whereby the viewing angle characteristics are improved. The optical paths in this case are set to be changed within a range of 2% to 5% with respect to an average value of the different optical paths, and the order of optical interference is set to be the same value in the portions with any optical paths.

However, in the light-emitting device disclosed in Japanese Patent Application Laid-Open No. 2006-32327, since light emission spectra having two different peak wavelengths are combined, there is a problem that the full width at half maximum of the composite spectrum is enlarged, which makes it difficult to improve the color purity of emission color.

Furthermore, in the light-emitting device disclosed in Japanese Patent Application Laid-Open No. 2007-234581, since the change in optical path in one light-emitting device or between adjacent pixels is about 2 to 5% of an average optical path, there is a problem that the effect of improving the viewing angle characteristics is small.

The present invention has been accomplished in view of the above-mentioned problems, and it is, therefore, an object of the present invention to provide an organic light-emitting device that has high color purity of light emission and enables excellent color reproduction, while having wide viewing angle characteristics. Furthermore, it is another object of the present invention to provide a display apparatus having the organic light-emitting device.

SUMMARY OF THE INVENTION

In order to achieve the above objects, in the present invention, portions with different optical paths for resonating light emitted from an emission layer are provided in one organic light-emitting device, in at least one pixel unit, or in one pixel, and the resonant wavelengths of the respective portions are set to be identical to each other. The term "pixel" herein employed refers to a minimum unit which constitutes an image in a display apparatus and includes an organic light-emitting device. The term "pixel unit" herein employed refers to a combination of a plurality of pixels. In the case of a full color display apparatus, it is general to design a mixture of pixels displaying different colors which can display white color, such as a pixel unit which is a combination of pixels displaying, for example, red, blue and green.

That is, the organic light-emitting device of the present invention is disposed on a substrate and includes: a first electrode; an emission layer; and a second electrode provided in the mentioned order from the substrate side, an optical path between a first reflective surface located on the first electrode side with respect to the emission layer and a second reflective surface located on the second electrode side with respect to the emission layer being set so as to resonate light emitted in the emission layer, and which has a first region in which the optical path is relatively short and is $L_1$ and a second region in which the optical path is relatively long and is $L_2$, wherein $L_1$ and $L_2$ are set so as to satisfy Expression 1 with resonant wavelengths $\lambda_1$, $\lambda_2$, and $\lambda_3$, a sum $\phi t$ of phase shifts when light is reflected by the first reflective surface and the second reflective surface, and a viewing angle $\alpha$:

$$\lambda_1 = 2L_1/(p - \phi t/2\pi)$$

$$\lambda_2 = 2L_2/(q + 1 - \phi t/2\pi)$$

$$\lambda_3 = 2L_2 \cos \alpha/(q - \phi t/2\pi)$$

$$\lambda_1 = \lambda_2 = \lambda_3 \qquad \text{(Expression 1)}$$

wherein p and q each independently represent a positive integer and $\alpha$ is not $0°$.

In addition, the display apparatus of the present invention includes a plurality of organic light-emitting devices constituting pixels disposed on a substrate, each of the organic light-emitting devices comprising: a first electrode; an emission layer; and a second electrode provided in the mentioned order from the substrate side, an optical path between a first reflective surface located on the first electrode side with respect to the emission layer and a second reflective surface located on the second electrode side with respect to the emission layer being set so as to resonate light emitted in the emission layer, and having a first pixel in which the optical path is relatively short and is $L_1$ and a second pixel in which the optical path is relatively long and is $L_2$, wherein $L_1$ and $L_2$ are set so as to satisfy Expression 2 with resonant wavelengths $\lambda_1$, $\lambda_2$, and $\lambda_3$, a sum $\phi t$ of phase shifts when light is reflected by the first reflective surface and the second reflective surface, and a viewing angle $\alpha$:

$$\lambda_1 = 2L_1/(p - \phi t/2\pi)$$

$$\lambda_2 = 2L_2/(q + 1 - \phi t/2\pi)$$

$$\lambda_3 = 2L_2 \cos \alpha/(q - \phi t/2\pi)$$

$$\lambda_1 = \lambda_2 = \lambda_3 \qquad \text{(Expression 2)}$$

wherein p and q each independently represent a positive integer and $\alpha$ is not $0°$.

According to the present invention, portions with different optical paths are provided in one organic light-emitting device, in at least one pixel unit, or in one pixel. Therefore, the viewing angle characteristics of the respective portions are different, and the entire device or display apparatus has emission characteristics in which the viewing angle characteristics are averaged. Therefore, the problem of the viewing angle dependence of the emission characteristics is overcome. Furthermore, since the emission enhancement wavelengths of the respective portions are set to be identical to each other, light emission with high color purity can be obtained without enlarging the full width at half maximum of the EL spectrum.

Further features of the present invention will become apparent from the following description of exemplary embodiments with reference to the attached drawings.

DESCRIPTION OF THE EMBODIMENTS

Regarding Change in Emission Characteristics

Figure 1:
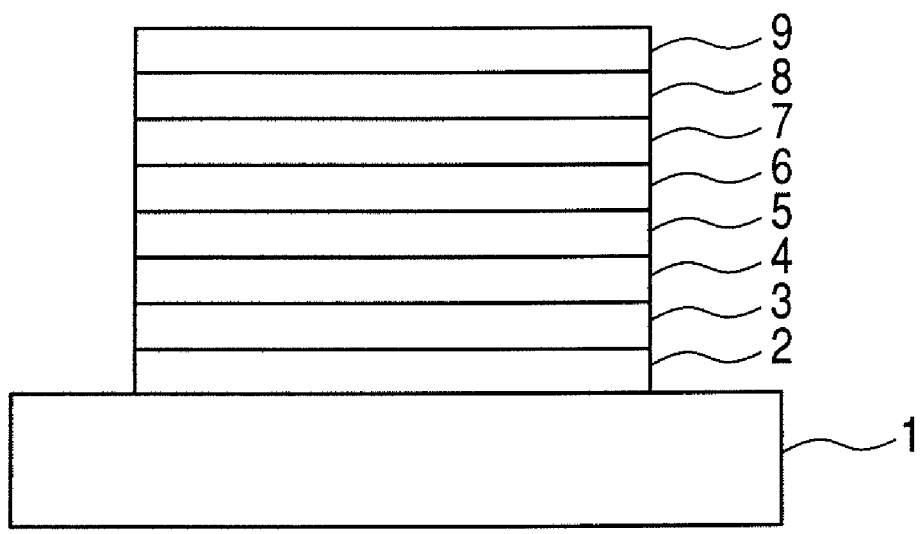
FIG. 1 is a schematic cross-sectional view of a conventional organic light-emitting device.
Figure 2:
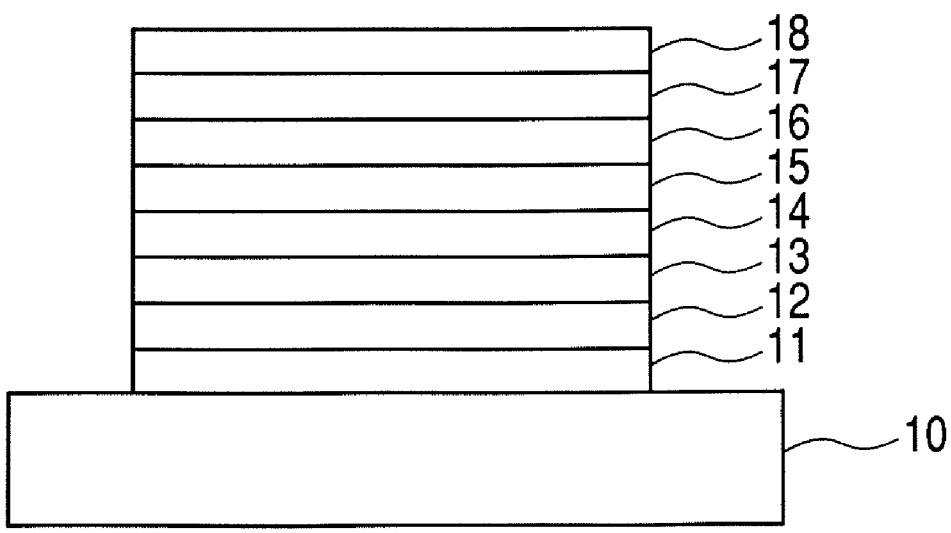
FIG. 2 is a schematic cross-sectional view of a general organic light-emitting device.

Before describing an organic light-emitting device of the present invention, first, a change in emission characteristics by a resonance effect is described using an example of a general organic light-emitting device illustrated in FIG. 2.

FIG. 2 is a schematic cross-sectional view of a top-emission type light-emitting device in which light is extracted from a side opposite to a substrate. In FIG. 2, the light-emitting device includes a substrate 10, a reflective layer 11, a transparent conductive layer 12, a hole-transporting layer 13, an emission layer 14, an electron-transporting layer 15, an electron injection layer 16, a semi-transmissive layer 17, and a transparent electrode 18. When a current is allowed to flow through the organic light-emitting device, holes injected from the reflective layer 11 and electrons injected from the semi-transmissive layer 17 are recombined in the emission layer 14, whereby light is emitted.

In such an organic light-emitting device, light generated in the device is subjected to enhancement by optical interference in a resonator structure formed between the interface of the reflective layer and the transparent conductive layer and the interface of the electron injection layer and the semi-transmissive layer. The resonant wavelength at which the light subjected to the enhancement is represented by the above-mentioned Equation 1, and is determined by structural parameters of the organic light-emitting device such as the optical path L of the resonator structure and the sum φt of phase shifts at the reflection interface, and the order m of optical interference.

In the case of the organic light-emitting device, the optical path L of the resonator structure is the sum of the optical paths of the layers existing between the interface of the reflective layer and the transparent conductive layer and the interface of the electron injection layer and the semi-transmissive layer. That is, the optical path L of the resonator structure is a sum $(n_1 d_1 + n_2 d_2 + \ldots)$ of products nd of refractive indices n and thicknesses d of the transparent conductive layer and the respective organic compound layers.

Furthermore, assuming that a material located on a light incident side is medium I and the other material is medium II of the two materials forming the reflection interface, and the optical constants of the materials are $(n_1, k_1)$ and $(n_2, k_2)$, respectively, the phase shift φ at the reflection interface can be represented by the following Equation 2. These optical constants can be measured by, for example, using a spectroscopic ellipsometer.

$$\phi = \tan^{-1}(2n_1 k_2/(n_1^2 - n_2^2 - k_2^2)) \text{ (where } 0 \leq \phi < 2\pi) \quad \text{(Equation 2)}$$

For example, in the case of the reflection interface formed at the interface between the reflective layer and the transparent conductive layer in the organic light-emitting device, the transparent conductive layer on the light incident side corresponds to the medium I and the reflective layer corresponds to the medium II. In the case of the interface between the electron injection layer and the semi-transmissive layer, the electron injection layer corresponds to the medium I and the semi-transmissive layer corresponds to the medium II. The sum φt of the phase shifts in Equation 1 is the result obtained by calculating the phase shifts at these two interfaces, respectively, and adding them up.

As can be seen from Equation 1, the resonant wavelength λ is proportional to the optical path L of the resonator structure. Thus, by regulating the film thicknesses of the layers located between the two reflection interfaces, the optical path L of the resonator structure can be changed and the resonant wavelength λ can be adjusted. Furthermore, even when the angle (viewing angle) e at which the light-emitting device is recognized visually changes, an effectual optical path changes, and the resonant wavelength at the viewing angle θ changes. Table 1 collectively shows a change in resonant wavelength in the case of changing the film thickness of the transparent conductive layer within a range of 69 to 110 nm in an organic light-emitting device in which the film thickness of each organic compound layer, the semi-transmissive layer, and the transparent electrode are set as shown in Table 2. Incidentally, the order m of optical interference is 2. It can be seen from Table 1 that the resonant wavelength can be adjusted by changing the optical path of the resonator structure. The optical constants of the respective layers are shown in Table 3.

TABLE 1

Relationship between thickness of transparent conductive layer and resonant wavelength

| Transparent conductive film | Resonant wavelength |
| --- | --- |
| 69 nm | 430 nm |
| 74 nm | 440 nm |
| 80 nm | 450 nm |
| 86 nm | 460 nm |
| 92 nm | 470 nm |
| 98 nm | 480 nm |
| 104 nm | 490 nm |
| 110 nm | 499 nm |

TABLE 2

Film thicknesses of respective layers

| Layer | Thickness |
| --- | --- |
| Transparent electrode | 34 nm |
| Semi-transmissive layer | 10 nm |
| Electron injection layer | 64 nm |
| Electron-transporting layer | 10 nm |
| Emission layer | 36 nm |
| Hole-transporting layer | 52 nm |
| Transparent conductive layer | 69 to 110 nm |
| Reflective layer | 100 nm |

TABLE 3

Optical constants of respective layers

| Wave-length (nm) | Reflective layer n | Reflective layer k | Transparent conductive layer n | Transparent conductive layer k | Hole-transporting layer n | Hole-transporting layer k | Emission layer n | Emission layer k | Electron-transporting layer n | Electron-transporting layer k | Electron injection layer n | Electron injection layer k | Semi-transmissive layer n | Semi-transmissive layer k |
|---|---|---|---|---|---|---|---|---|---|---|---|---|---|---|
| 430 | 0.62 | 3.96 | 1.95 | 0 | 1.97 | 0 | 2.03 | 0 | 1.84 | 0 | 1.84 | 0.01 | 0.24 | 6.38 |
| 440 | 0.65 | 4.06 | 1.94 | 0 | 1.92 | 0 | 1.98 | 0 | 1.81 | 0 | 1.81 | 0.01 | 0.24 | 6.38 |
| 450 | 0.68 | 4.15 | 1.92 | 0 | 1.89 | 0 | 1.94 | 0 | 1.79 | 0 | 1.79 | 0.01 | 0.25 | 6.38 |
| 460 | 0.71 | 4.25 | 1.91 | 0 | 1.87 | 0 | 1.91 | 0 | 1.77 | 0 | 1.77 | 0.01 | 0.25 | 6.38 |
| 470 | 0.73 | 4.34 | 1.89 | 0 | 1.86 | 0 | 1.89 | 0 | 1.76 | 0 | 1.76 | 0.01 | 0.26 | 6.38 |
| 480 | 0.76 | 4.43 | 1.88 | 0 | 1.84 | 0 | 1.87 | 0 | 1.75 | 0 | 1.75 | 0.01 | 0.26 | 6.38 |
| 490 | 0.79 | 4.52 | 1.87 | 0 | 1.84 | 0 | 1.86 | 0 | 1.74 | 0 | 1.74 | 0.01 | 0.27 | 6.38 |
| 500 | 0.82 | 4.61 | 1.85 | 0 | 1.83 | 0 | 1.85 | 0 | 1.73 | 0 | 1.73 | 0.01 | 0.28 | 6.38 |

Next, regarding the change in resonant wavelength depending upon the order m of optical interference, two cases in which the film thicknesses of the transparent conductive layers were different were studied. Table 4 shows a change in resonant wavelength when viewed in front of the organic light-emitting device (namely, in a direction perpendicular to a light extraction surface of the device) in the case where the order m was changed within the range of 1 to 4 in the organic light-emitting devices in which the film thicknesses of the transparent conductive layers were 74 nm and 184 nm. The film thicknesses of the layers other than the transparent conductive layer were set as shown in Table 2.

TABLE 4

Order and resonant wavelength

| | Resonant wavelength | |
|---|---|---|
| Order | Transparent conductive layer 74 nm | Transparent conductive layer 184 nm |
| 1 | 798 nm | 1,145 nm |
| 2 | 440 nm | 631 nm |
| 3 | 303 nm | 435 nm |
| 4 | 232 nm | 322 nm |

The resonant wavelength is also influenced by the angle (viewing angel) θ at which the device is viewed visually. Then, four resonant wavelengths existing within the wavelength region of visible light when viewed from the front in the case where the film thickness of the transparent conductive layer is 74 nm (m=1 and m=2) and in the case where the film thickness of the transparent conductive layer is 184 nm (m=2 and m=3) were paid attention to, and it was estimated how they were changed depending upon the viewing angle. Table 5 collectively shows the results indicating how the four resonant wavelengths change depending upon the viewing angle, which was obtained by calculation using Equation 1.

TABLE 5

Resonant wavelength and viewing angle

| | Transparent conductive layer 74 nm | | Transparent conductive layer 184 nm | |
|---|---|---|---|---|
| Viewing angle | m = 1 | m = 2 | m = 2 | m = 3 |
| 0° | 798 nm | 440 nm | 631 nm | 435 nm |
| 10° | 786 nm | 433 nm | 621 nm | 429 nm |

TABLE 5-continued

Resonant wavelength and viewing angle

| | Transparent conductive layer 74 nm | | Transparent conductive layer 184 nm | |
|---|---|---|---|---|
| Viewing angle | m = 1 | m = 2 | m = 2 | m = 3 |
| 20° | 750 nm | 413 nm | 593 nm | 409 nm |
| 30° | 691 nm | 381 nm | 546 nm | 377 nm |
| 40° | 611 nm | 337 nm | 483 nm | 334 nm |
| 45° | 564 nm | 311 nm | 446 nm | 308 nm |
| 50° | 513 nm | 283 nm | 406 nm | 280 nm |
| 60° | 399 nm | 220 nm | 315 nm | 218 nm |

According to Table 5, in the case of the film thickness of the transparent conductive layer of 74 nm and the order m of 2, the resonant wavelength in the case of observing the organic light-emitting device from the front is 440 nm, and when viewed with the viewing angle changed, the resonant wavelength is shifted to a wavelength side shorter than 440 nm. Further, in the case of viewing the organic light-emitting device having the transparent conductive layer of 184 nm from the front thereof, two resonant wavelengths of 631 nm (m=2) and 435 nm (m=3) are observed in the visible light region. These resonant wavelengths are also shifted to a shorter wavelength side due to the change in viewing angle. In particular, when the condition of the resonant wavelength of 631 nm (m=2) is paid attention to, the resonant wavelength at a viewing angle of 45° is 446 nm. This is approximately identical to a resonant wavelength of 440 nm in the case of observing the organic light-emitting device having the transparent conductive layer with a film thickness of 74 nm from the front thereof under the condition of m=2, and a resonant wavelength of 435 nm in the case of observing the organic light-emitting device having a transparent conductive layer with a film thickness of 184 nm from the front thereof under the condition of m=3.

Thus, the resonant wavelength of 631 nm (m=2) is different from that under the condition of the transparent conductive layer with a film thickness of 74 nm and m of 2, and that under the condition of the transparent conductive layer with a film thickness of 184 nm and m of 3, in the case of recognizing an organic light-emitting device from the front thereof. However, as described above, the resonant wavelength in the condition of 631 nm (m=2) when viewed from the front becomes approximately identical to the resonant wavelengths when viewed from the front under the two other conditions, in the case where the viewing angle changes to 45°. By utilizing the change in resonant wavelength due to the optical path of an organic light-emitting device, the viewing angle at which the light-emitting device is viewed visually, and the order of optical interference, the emission characteristics of the organic light-emitting device can be adjusted. For example, in the case where the adjustment of an emission color is paid attention to, when the resonant wavelength is set so as to be shifted to a longer wavelength side with respect to the peak wavelength of a PL spectrum peculiar to the material constituting the emission layer, the EL spectrum can be set to be a longer wavelength side. Furthermore, when the resonant wavelength is set so as to be shifted to a shorter wavelength side, the EL spectrum can be set to be on a shorter wavelength side.

Table 6 collectively shows changes in resonant wavelength, emission chromaticity, and relative luminance in the case of viewing a light-emitting device from the front thereof, when the film thickness of the transparent conductive layer is changed within the range of 69 to 110 nm in the organic light-emitting device in which the film thicknesses of organic compound layers, semi-transmissive layer, and transparent electrode are set as shown in Table 2. Incidentally, the emission layer of the device shows a blue PL spectrum illustrated in FIG. 3. The PL spectrum can be measured by a general-purpose spectrophotometer.

TABLE 6

Change in emission characteristics

| Film thickness of transparent conductive layer | Resonant wavelength | Emission chromaticity | | Relative luminance |
|---|---|---|---|---|
| | | CIEx | CIEy | |
| 69 nm | 430 nm | 0.139 | 0.075 | 0.26 |
| 74 nm | 440 nm | 0.134 | 0.091 | 0.35 |
| 80 nm | 450 nm | 0.129 | 0.115 | 0.48 |
| 86 nm | 460 nm | 0.125 | 0.144 | 0.62 |
| 92 nm | 470 nm | 0.122 | 0.175 | 0.76 |
| 98 nm | 480 nm | 0.12 | 0.208 | 0.87 |
| 104 nm | 490 nm | 0.119 | 0.241 | 0.96 |
| 110 nm | 499 nm | 0.12 | 0.274 | 1 |

As described above, by changing a resonant wavelength by an optical path of a resonator structure, emission characteristics such as emission chromaticity and luminance of an organic light-emitting device can be adjusted.

Then, the change in characteristics of an organic light-emitting device, in which the order of optical interference is paid attention to, is described.

Figure 4:
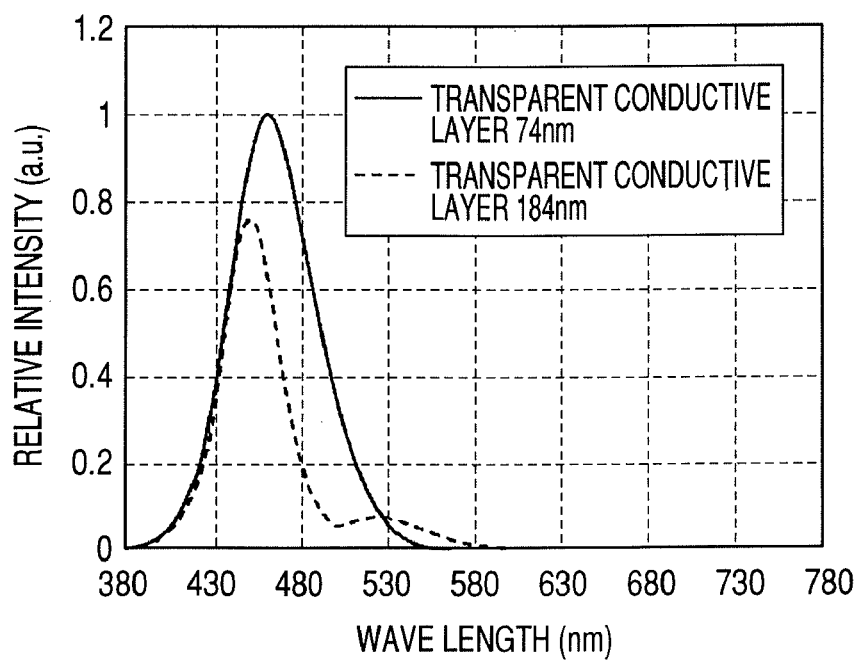
FIG. 4 is a graphical representation illustrating emission spectra of an organic light-emitting device.

FIG. 4 illustrates EL spectra in the case of observing organic light-emitting devices from the front thereof, in which the film thickness of a transparent conductive layer is set to 74 nm and 184 nm, and the film thicknesses of the other layers are set as shown in Table 2. Table 7 shows the emission chromaticity of each of the organic light-emitting devices.

TABLE 7

| Film thickness of transparent conductive layer | Emission chromaticity | |
|---|---|---|
| | CIEx | CIEy |
| 74 nm | 0.134 | 0.091 |
| 184 nm | 0.157 | 0.083 |

As can be seen from Table 4, the resonant wavelength in the case of the order of optical interference m of 2 when the film thickness of the transparent conductive layer is 74 nm and the resonant wavelength in the case of the order m of 3 when the film thickness of the transparent conductive layer is 184 nm are 440 nm and 435 nm, respectively, which are approximately identical to each other. As illustrated in FIG. 4, the peak intensity ratio of these emission spectra was about 1:0.75, and stronger light emission was observed from a device in which the film thickness of the transparent conductive layer was 74 nm. The reason for this is that even in the case where the resonant wavelengths are approximately identical to each other by the influence of the order of optical interference, there is a difference in effects of enhancement by resonance, and hence, the effect of enhancement increases as the order decreases. That is, in these organic light-emitting devices, the effect of stronger resonance can be obtained in the device in which the film thickness of the transparent conductive layer is 74 nm, compared with the device in which the film thickness of the transparent conductive layer is 184 nm, when viewed in front of the device.

Therefore, even if the resonant wavelengths are approximately identical to each other, there is a slight difference in emission chromaticity as shown in Table 7. However, particularly in the case of a blue light-emitting device, when the chromaticity coordinate of CIEy is ±0.01 and is within a range of 0.02, the human's eye does not feel the color difference in visual recognition, and thus, emission colors can be considered to be identical in a practical use.

Figure 3:
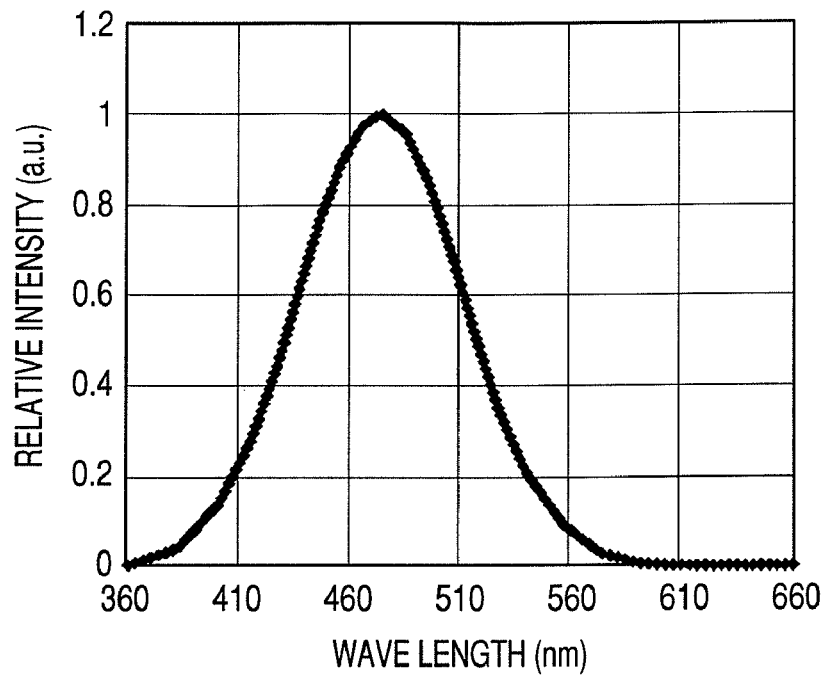
FIG. 3 is a graphical representation illustrating a PL spectrum of a blue emission layer.

In Table 4, the device in which the film thickness of a transparent conductive layer is 184 nm has a resonant wavelength of 631 nm under the condition of the order m of 2. However, as illustrated in FIG. 3, the PL spectrum of the emission layer has an intensity of almost 0 in a wavelength region of 600 nm or more, and hence this resonant wavelength hardly influences the emission characteristics of a device when viewed in front of the device.

Next, the relationship between the angle (viewing angle) for visual recognition and the emission characteristics are described. As shown in Table 4, in the organic light-emitting device in which the film thickness of the transparent conductive layer is 74 nm, the resonant wavelength becomes 440 nm when viewed from the front when the order of optical interference m is 2. The emission layer of the organic light-emitting device has a PL spectrum with a peak wavelength of 475 nm and a full width at half maximum of 74 nm as illustrated in FIG. 3. Therefore, in the case of viewing the light-emitting device from the front (i.e., viewing angle of 0°), the resonant wavelength of 440 nm at the order m of 2 overlaps the PL spectrum of the emission layer, which influences the emission characteristics.

When the angle at which the organic light-emitting device is viewed visually changes, the resonant wavelength is shifted to a shorter wavelength side as shown in Table 5. Therefore, the overlapping of the resonant wavelength of 440 nm at the order m of 2 when viewed from the front with the PL spectrum becomes small with the change in viewing angle, and the influence on emission characteristics becomes small.

Furthermore, in the organic light-emitting device in which the film thickness of the transparent conductive layer is 184 nm, the resonant wavelengths are 631 nm and 435 nm, respectively, in the case where the order of optical interference m is 2 and 3. In the case where the device is viewed visually in front thereof, the resonant wavelength of 435 nm at the order m of 3 is included in the wavelength region of the PL spectrum of the emission layer, which influences the emission characteristics. Moreover, as described above, since the resonant wavelength of 631 nm at the order m of 2 is not included in the wavelength region of the PL spectrum of the emission layer, the resonant wavelength hardly influences the emission characteristics in the case where the organic light-emitting device is viewed visually from the front thereof.

However, when the viewing angle increases, all the resonant wavelengths are shifted to a shorter wavelength side, as shown in Table 5. Therefore, since the resonant wavelength at the order m of 3 is deviated from the peak wavelength of the PL spectrum with the increase in viewing angle, the influence on emission characteristics becomes small. On the other hand, the resonant wavelength at the order m of 2 starts to be included in the wavelength region of the PL spectrum as the viewing angle increases. Although not described in Table 5, the resonant wavelength of 631 nm when viewed from the front becomes 475 nm at a viewing angle of 41.2°, which is identical to the wavelength at which the emission intensity of the PL spectrum is the highest. Thus, the influence of the resonant wavelength of 631 nm at the order m of 2 when viewed from the front on the emission characteristics increases as the viewing angle increases. Thus, the resonant wavelength at the order m of 2 of the organic light-emitting device in which the film thickness of the transparent conductive layer is 184 nm exerts more influence on the emission characteristics as the viewing angle increases.

Figure 5:
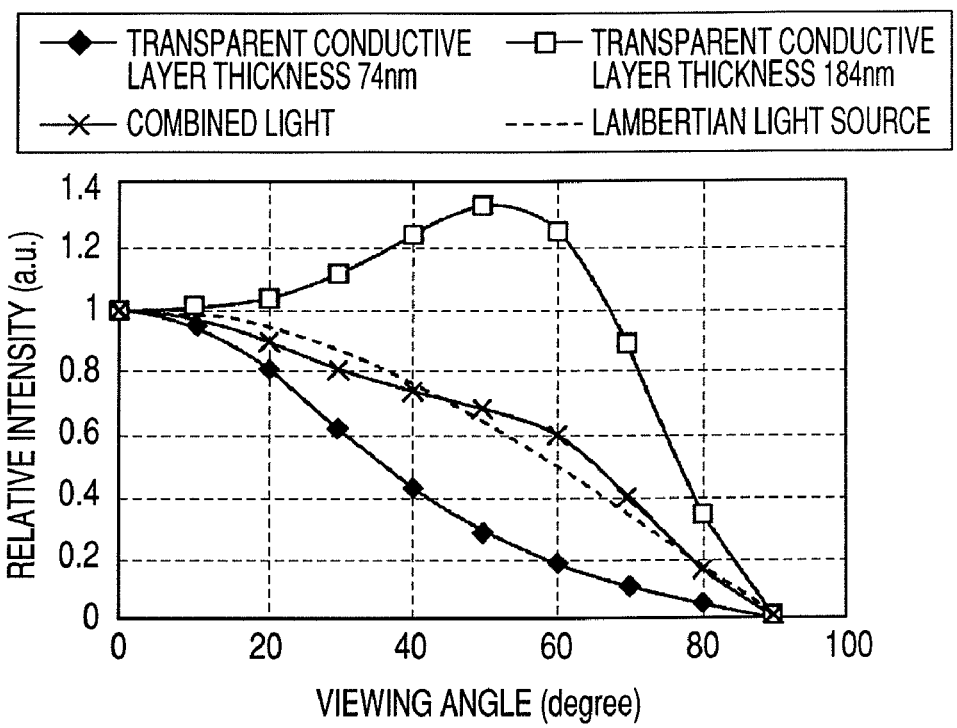
FIG. 5 is a graphical representation illustrating a viewing angle vs. relative luminance profile of an organic light-emitting device.

FIG. 5 illustrates changes in relative luminance depending upon the viewing angle in the case where the front surface emission luminance of organic light-emitting devices (namely, the emission luminance when observed in a direction perpendicular to a light extraction surface of a device) in which the film thicknesses of the transparent conductive layers are 74 nm and 184 nm is defined as 1, and the organic light-emitting devices are observed in a viewing angle of 0 to 90°. FIG. 5 also illustrates a change in relative luminance depending upon the viewing angle of light emission obtained by combining light emissions in the case of the transparent conductive layer with a film thickness of 74 nm and the transparent conductive layer with a film thickness of 184 nm at a ratio of 1:1. FIG. 5 also illustrates a luminance profile of a Lambertian light source in which equal luminance is obtained even when a light-emitting device is viewed visually at any angle.

As illustrated in FIG. 5, the profile of viewing angle vs. relative luminance varies depending upon the film thickness of the transparent conductive layer. In the organic light-emitting device in which the film thickness of the transparent conductive layer is 74 nm, luminance decreases as the viewing angle increases. However, in the organic light-emitting device in which the film thickness of the transparent conductive layer is 184 nm, as the viewing angle increases, the intensity increases to be highest (i.e., a luminance ratio of 1.3 in the front direction (namely, in a direction perpendicular to a light extraction surface of the device)) at or near the viewing angle of 50°.

These changes are attributable to that the effectual optical path changes due to the increase in the viewing angle, and the resonant wavelength is shifted to a shorter wavelength side. In the light-emitting device in which the film thickness of the transparent conductive layer is 74 nm, the resonant wavelength at the order m of 2 is shifted to a shorter wavelength with the increase in the viewing angle and falls in a wavelength range in which emission intensity is low in the PL spectrum of the emission layer, and the luminance decreases. The reduction of the gradient of the luminance lowering involved in the increase of the viewing angle beginning at or near a viewing angle of 50° is attributable to that the influence of the resonant wavelength at the order m of 1 is further exerted.

On the other hand, in the light-emitting device in which the film thickness of the transparent conductive layer is 184 nm, although the influence of the resonant wavelength at the order m of 3 decreases due to the viewing angle, the resonant wavelength at the order m of 2 is shifted to a shorter wavelength side due to the increase in the viewing angle, which influences emission characteristics. The resonant wavelength becomes 483 to 406 nm at or near the viewing angle of 40° to 50° and is included in the wavelength range in which the emission intensity is high in the PL spectrum. Therefore, the effect of resonance acts strongly, and the luminance at these angles becomes maximum.

As described above, when the optical path of the resonator structure is set considering the relationship between the resonant wavelength at a viewing angle $\alpha$ and the order of optical interference, a change in emission characteristics involved in a change in a viewing angle can be controlled. At this time, it is preferred that the viewing angle $\alpha$ be set within the range of $0° < |\alpha| < 60°$, because the viewing angle characteristics can be compensated in a wide range.

Furthermore, FIG. 5 illustrates a viewing angle vs. relative luminance change profile of light emission obtained by combining light emissions in the case of the transparent conductive layer with a film thickness of 74 nm and the transparent conductive layer with a film thickness of 184 nm at a ratio of 1:1. As illustrated in FIG. 5, the profile of the combined light is substantially the same as to that of a Lambertian light source. Therefore, light obtained by combining lights emitted from two devices can provide light emission which is substantially the same as that of a Lambertian light source even when viewed visually at any angle.

(Regarding Configuration of Organic Light-Emitting Device According to Present Invention)

The present inventors have paid attention to that the resonant wavelength and the effect of enhancement change due to an optical path, a viewing angle, and an order of optical interference, and hence the emission characteristics when a device is viewed visually in front of the device can be adjusted. Furthermore, attention was paid to that a change in emission characteristics involved in a change in viewing angle can be adjusted by combining light emissions having different luminance profiles.

In the present invention, in order to obtain an organic light-emitting device that emits light with excellent color purity in the front direction (namely, in a direction perpendicular to a light extraction surface of the device) and has excellent display characteristics even at a viewing angle in a wide range, a first region in which an optical path was relatively short and a second region in which an optical path was relatively long are provided in the light-emitting device. Then, the optical path $L_1$ of the first region and the optical path $L_2$ of the second region in the case where the device is viewed visually in front thereof is set so as to satisfy the relationship of Equation 3 with resonant wavelengths $\lambda_1$, $\lambda_2$, and $\lambda_3$, the sum $\phi t$ of phase shifts, and the viewing angle $\alpha$.

(Equation 3)

$$\lambda_1 = 2L_1/(p - \phi t/2\pi) \quad (1)$$

$$\lambda_2 = 2L_2/(q + 1 - \phi t/2\pi) \quad (2)$$

$$\lambda_3 = 2L_2 \cos \alpha/(q - \phi t/2\pi) \quad (3)$$

$$\lambda_1 = \lambda_2 = \lambda_3 \quad (4)$$

wherein p and q each independently represent a positive integer and $\alpha$ is not 0°.

Furthermore, in the organic light-emitting device, the resonant wavelengths of the two regions provided in the device are identical to each other, but the optical paths thereof are different from each other. The first region has a low-order optical interference condition and the second region has a high-order optical interference condition in the front direction. Thus, in the first region, the effect of stronger resonance compared with that in the second region can be obtained, and higher luminance can be obtained in front of the device. That is, in the first region, emission characteristics are adjusted giving a priority to the characteristics in front of the device.

On the other hand, in the second region, a change in emission characteristics involved in a change in a viewing angle is adjusted. In order to attain this, the second region is set so as to have at least two different resonance conditions. A first resonance condition is such that emitted lights interfere with and enhance each other at an order q+1 which is higher than that in the first region regarding the same resonant wavelength as that of $L_1$ at the front (namely, in a direction perpendicular to a light extraction surface of the device). A second resonance condition is such that emitted lights interfere with and enhance each other at an order q lower than that in the front direction regarding the same resonant wavelength as that in the front direction of $L_1$, at a viewing angle α. At this time, the resonant wavelength $\lambda_4$ of the order q in the front direction of the second region satisfies the following Equation 4 and is in a wavelength region which is not included in the wavelength region of the PL spectrum of the emission layer.

$$\lambda_4 = 2L_2/(q - \phi t/2\pi) \quad \text{(Equation 4)}$$

wherein q represents a positive integer.

Thus, since the resonant wavelength $\lambda_2$ in the front direction of $L_2$ to be approximately the same as the resonant wavelength $\lambda_1$ in the front direction of $L_1$ has an interference condition of an order higher than that of $L_1$, the effect of adjusting the emission characteristics is lower than that in the first region. However, since the resonant wavelengths $\lambda_1$ and $\lambda_2$ are the same, emission colors in the first region and the second region can be set to be the same in the case where the device is viewed visually from the front. Further, in the case where the viewing angle is changed, the resonant wavelengths are shifted to a shorter wavelength side, and the resonant wavelengths $\lambda_1$ and $\lambda_2$ fall, with the change in the viewing angle, in a wavelength region in which the intensity in the PL spectrum of the emission layer is small, and the influence on the emission characteristics becomes small. On the other hand, the resonant wavelength $\lambda_4$ satisfying an interference condition of an order higher than that of the resonant wavelength $\lambda_2$ in front of $L_2$ changes, with the change in the viewing angle, to the wavelength region in which the emission intensity of the PL spectrum of the emission layer is high, and then, at a viewing angle α, satisfies the resonance condition regarding approximately the same resonant wavelength $\lambda_3$ as the resonant wavelengths $\lambda_1$ and $\lambda_2$. That is, the resonant wavelength satisfying an interference condition of an order higher than that of the resonant wavelength $\lambda_2$ does not influence the emission characteristics in the front direction, but influences the emission characteristics due to the change in the viewing angle. Therefore, the viewing angle characteristics of the light-emitting device can be adjusted, using these features.

Accordingly, in the second region, the emission color equal to that in the first region is exhibited in the case where the light-emitting device is viewed visually from the front thereof, and the emission characteristics depending upon the viewing angle can be adjusted to those different from the emission characteristics in the first region.

At this time, the emission characteristics as a whole device become those obtained by combining the characteristics in the first and the second regions. In the organic light-emitting device of the present invention, the resonant wavelengths at the front in the respective portions are set to be the same. Therefore, the emission color in the case where the light-emitting device is viewed visually from the front is the same as a whole device, and hence the color irregularity in the device due to the difference in optical interference condition is not caused.

Similarly, the emission characteristics depending upon the viewing angle are also those obtained by combining the characteristics of the respective regions. Therefore, the viewing angle characteristics in the second region may be set, considering the viewing angle characteristics in the first region, in such a manner that the viewing angle characteristics of combined light become desired viewing angle emission characteristics. That is, the viewing angle characteristics as a whole device are compensated with the viewing angle characteristics in the second region. In particular, it is preferred that the viewing angle vs. relative luminance profile of the combined light be set so as to be the same as that of a Lambertian diffusion light source, because the lowering in the luminance decreases is small even when the device is viewed visually in oblique direction.

In the case of mixing a plurality of different emitted lights to obtain a combined light, the chromaticity coordinates $(x_t, y_t)$ and the luminance $Y_t$ of the combined light can be calculated as follows. Specifically, assuming that the chromaticity coordinates of light emission are $(x_i, y_i)$ and the luminance of light emission is $Y_i$ (i=1, 2, ...), they can be calculated using the following Equation 5.

$$x_t = (x_1 S_1 + x_2 S_2 + \ldots + x_i S_i)/(S_1 + S_2 + \ldots + S_i) \quad \text{(Equation 5)}$$
$$y_t = (y_1 S_1 + y_2 S_2 + \ldots + y_i S_i)/(S_1 + S_2 + \ldots + S_i)$$
$$= (Y_1 + Y_2 + \ldots + Y_i)/(S_1 + S_2 + \ldots + S_i)$$
$$S_i = Y_i / y_i$$
$$Y_t = Y_1 + Y_2 + \ldots + Y_i$$

The organic light-emitting device of the present invention is set such that the relationship of Equation 3 was satisfied between the optical path and the resonant wavelength in the device. Thus, a light-emitting device having both the excellent emission efficiency at the front and the wide viewing angle characteristics can be realized.

Incidentally, the equal sign "=" herein employed does not mean strict equality, but means substantial equality in a conceptual sense. For example, in Equation 3(3), even in the case where two resonant wavelengths are not identical to each other strictly, the emission chromaticities of the organic light-emitting device may be in the range in which the two resonant wavelengths are considered to be identical to each other in a practical use, and specifically may be within the range of +10 nm.

Furthermore, the above description has been made by taking, as an example, the case where the resonant wavelength when the film thickness of the transparent conductive layer is 74 nm and the order m is 2 is brought into conformity with the resonant wavelength when the film thickness of the transparent conductive layer is 184 nm and the order m is 3 mainly at the front. In this case, a relationship of p=2 and q=2 is satisfied in Equation 3.

However, in the present invention, there is no particular limitation to p and q, and similar effects can be expected even in the case where p is 3 or more and q is 3 or more. Table 8 shows an example of a change in the viewing angles of resonant wavelengths in respective orders of the organic light-emitting devices in which the film thicknesses of the transparent conductive layers are 74 nm and 300 nm.

TABLE 8

Resonant wavelength and viewing angle

| Viewing angle | Transparent conductive Layer 74 nm | | Transparent conductive layer 300 nm |
|---|---|---|---|
| | Numerical expression 5 order m = 2 | Numerical expression 5 order m = 3 | Numerical expression 1 order m = 4 |
| 0° | 440 nm | 575 nm | 439 nm |
| 10° | 433 nm | 566 nm | 432 nm |
| 20° | 413 nm | 540 nm | 412 nm |
| 30° | 381 nm | 498 nm | 380 nm |
| 40° | 337 nm | 440 nm | 336 nm |
| 50° | 283 nm | 369 nm | 282 nm |
| 60° | 220 nm | 287 nm | 219 nm |

As shown in Table 8, the film thickness of the transparent conductive layer is changed and the optical path of the light-emitting device is adjusted, whereby the resonant wavelengths at the front at m=2 and m=4 in Equation 1 can be brought into conformity with each other. Furthermore, when the viewing angle is changed, the state can be seen in which the resonant wavelength at a lower order (i.e., m=3) is shifted to the wavelength region in which the resonant wavelength can overlap the PL spectrum of the emission layer. The condition of the combination of m=2 and m=4 in Equation 1 corresponds to the condition of p=2 and q=3 in Equation 3. Thus, even the condition of q=3 or more is applicable to an organic light-emitting device.

However, in the case where the transparent conductive layer is 300 nm, as shown in Table 9 below, the emission chromaticity is remarkably different from that when the transparent conductive layer is set to be 74 nm. In particular, the chromaticity coordinate of CIEy changes by about 0.1, and hence a slight difference in color is recognized when viewed visually with the human eye.

TABLE 9

Emission chromaticity

| Film thickness of transparent conductive layer | Emission chromaticity | |
|---|---|---|
| | CIEx | CIEy |
| 74 nm | 0.134 | 0.091 |
| 300 nm | 0.164 | 0.192 |

Therefore, it is preferred that the resonant wavelengths be brought into conformity with each other at an order that is as low as possible. Furthermore, as described above, the effect of resonance enhancement is larger as the order is lower. Therefore, it is preferred that p and q be as small as possible even in the case of considering the degree of freedom of the emission characteristic adjustment.

In order to satisfy the condition of p=1 and/or q=1 in Equation 3, it is necessary to set the film thicknesses of the transparent conductive layer and the organic compound layer to be small. In order to realize the order m of 1 and the resonant wavelength of 440 nm in the organic light-emitting device, it is necessary to change the film thicknesses of the transparent conductive layer and the hole-transporting layer remarkably. Although there are some combinations for such thicknesses, as an example, it is necessary to set the transparent conductive layer to be 8 nm and the hole-transporting layer to be 10 nm. If the film thicknesses of the transparent conductive layer and the hole-transporting layer are set to be so small, short-circuiting due to foreign matter or dust taken in at the time of device production and the like occur, which is a problem. Therefore, the combination of p=2 and q=2 is particularly preferred.

Furthermore, such setting of the resonant wavelengths can be applied to organic light-emitting devices that exhibit various emission colors. Generally, an organic blue-light-emitting device has an emission efficiency lower than those of devices of the other emission colors. Therefore, in order to obtain a high emission efficiency in front of an organic blue-light-emitting device, for example, a means for concentrating radiation characteristics of light emission to the front surface of the device using a microcavity or the like to thereby enhance the apparent emission efficiency is used. At this time, the light emission radiation intensity in a region other than the front surface is weakened, and hence the light emitted from the device is visually recognized to be dark when observed at some viewing angle.

When the present invention is applied to a device with a relatively low emission efficiency resulting from such a light-emitting material, in particular to a blue-light-emitting device, a balance can be struck between a high emission efficiency in front of the device and satisfactory viewing angle characteristics, which is preferable. Furthermore, the materials of respective layers constituting an organic light-emitting device have wavelength dispersion characteristics of refractive index, and in particular, the change in refractive index is larger on the shorter wavelength side. Therefore, the change in EL spectrum depending on the viewing angle is larger, especially in a blue-light-emitting device. Also from this point of view, it is preferable that the present invention is applied to a blue-light-emitting device. The term "blue light emission" herein employed refers to light emission in a wavelength region having a peak wavelength of 400 to 500 nm.

Furthermore, it is preferred that the configuration of providing portions with different optical paths of the present invention be applied to an organic light-emitting device in which the resonant wavelength of the organic light-emitting device is required to be set on a side of a wavelength shorter than a peak wavelength of the PL spectrum of the emission layer due to the requirement of emission chromaticity. When the resonant wavelength is set on a side of a wavelength longer than the peak wavelength of the PL spectrum of the emission layer, the resonant wavelength approaches the peak wavelength of the PL spectrum as a viewing angle increases. Therefore, the viewing angle vs. relative luminance change profile does not have a curved shape showing a monotonous decrease. Consequently, it becomes difficult to combine lights in portions (A portion and B portion) having different emission characteristics and make the profile close to that of a Lambertian light source.

Embodiment 1

The organic light-emitting device of the present invention is described in detail with reference to the drawings below.

Figure 6:
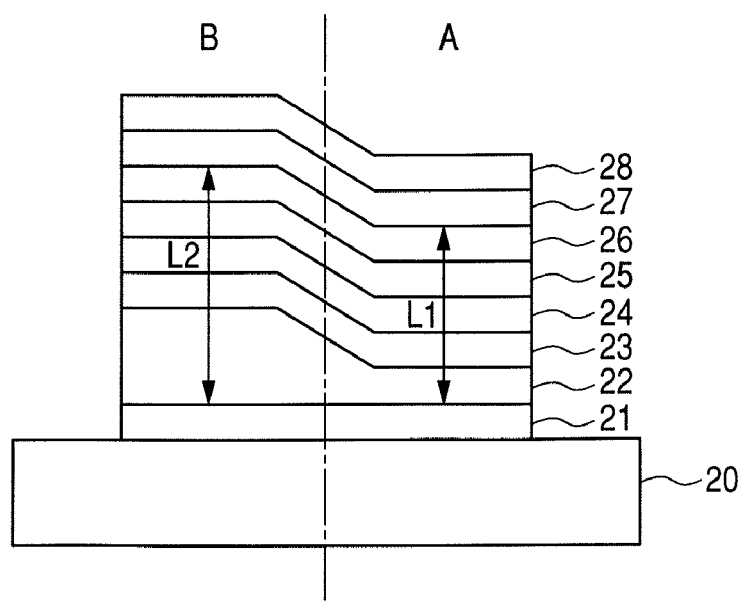
FIG. 6 is a schematic cross-sectional view of an organic light-emitting device according to Embodiment 1.

FIG. 6 is a schematic cross-sectional view of a top-emission type light-emitting device, as an example of the organic light-emitting device of the present invention. In FIG. 6, the organic light-emitting device includes a substrate 20, a reflective layer 21, a transparent conductive layer (anode) 22, a hole-transporting layer 23, an emission layer 24, an electron-transporting layer 25, an electron injection layer 26, a semi-transmissive layer 27, and a transparent electrode (cathode)

28. When a current is allowed to flow through the organic light-emitting device with the transparent conductive layer being used as the anode and the transparent electrode being used as the cathode, holes injected from the transparent conductive layer 22 and electrons injected from the semi-transmissive layer 27 to the organic compound layer are recombined in the emission layer 24, whereby light is emitted.

Incidentally, in the present embodiment, an example of the configuration in which the anode is formed on the substrate 20 has been illustrated. However, the cathode, the organic compound layer, and the anode may be formed in the mentioned order from the substrate side, and there is no particular limitation to the stacking order of the electrodes.

There is no particular limitation to the substrate 20 used in the present invention, and metal, ceramic, glass, quartz, or the like is used. Furthermore, a flexible substrate using a flexible sheet such as a plastic sheet can also be used. The reflective layer 21 and the transparent conductive layer 22 (first electrode) are formed on the substrate 20. It is desired that the reflective layer 21 have a reflectance at an interface with the transparent conductive layer of at least 50% or more, and preferably 80% or more. The interface between the reflective layer 21 and the transparent conductive layer 22 provided on the emission layer side is a first reflective surface located on the first electrode side forming a resonator structure in the organic light-emitting device of the present embodiment.

Furthermore, in the present embodiment, for convenience of presentation, an example has been described in which the reflective layer 21 is in contact with the transparent conductive layer 22 and also functions as a conductive member (electrode). However, the reflective layer 21 only needs to be formed of a member having characteristics of reflecting emitted light. The reflective layer 21 may have a function as a conductive member (electrode), or an electrode may be provided separately from the reflective layer 21. Thus, in the case of providing an electrode separately from the reflective layer 21, for example, an insulating member such as a dielectric multi-layered film mirror can be used as a reflective layer.

There is no particular limitation to the material constituting the reflective layer 21, and for example, metal such as silver, aluminum, or chromium, an alloy thereof, or the like is used.

As the transparent conductive layer 22, a metal oxide conductive film, specifically, a compound film (ITO) of indium oxide and tin oxide, a compound film (IZO) of indium oxide and zinc oxide, or the like can be used. The term "transparent" herein employed refers to having a transmittance of 70 to 100% with respect to visible light, and more specifically, it is preferred that an extinction coefficient κ be 0.05 or less, preferably 0.01 or less from the viewpoint of suppressing the extinction of emitted light in the transparent conductive layer.

Organic compounds used for the organic compound layers such as the hole-transporting layer 23, the emission layer 24, the electron-transporting layer 25, and the electron injection layer 26 may be composed of a low-molecular material, a polymer material, or both materials. Furthermore, it is also possible to apply a fluorescent material, a phosphorescent material, or the like, and there is no particular limitation thereto. A well-known material can be used as needed.

Furthermore, as the electron injection layer 26, for example, electron injection materials that are generally widely used, such as lithium fluoride, alkali metal, alkaline-earth metal, can be used. Further, alkali metal, alkaline-earth metal, or a compound thereof may be contained in the electron-transporting organic compound material in an amount of 0.1% to several tens % to obtain an electron injection layer. At this time, it is preferred that the film thickness of the electron injection layer be set to be about 10 to 100 nm, because the film formation damage of the semi-transmissive layer 27 and the transparent electrode 28 to be formed later can be alleviated.

The organic compound layer of the present invention is obtained by forming a thin film generally by vacuum evaporation, ionized evaporation, sputtering, plasma CVD, or by dissolving an organic compound in an appropriate solvent and coating the solution by a known coating method (e.g., spin coating, dipping, casting, or ink-jet method).

As the semi-transmissive layer 27, an elemental metal such as aluminum, silver, magnesium, or calcium, or an alloy thereof can be used. In particular, an alloy of silver and magnesium (silver magnesium) is preferred from the viewpoint of the injectability of electrons and the reflectance of emitted light. Further, it is preferred that the film thickness of the semi-transmissive layer be selected from the range of 2 nm or more and 50 nm or less from the viewpoint of emitted light extraction efficiency, because a part of emitted light passes through the semi-transmissive layer. In the case of such a device structure, although emitted light is reflected also by the interface between the semi-transmissive layer 27 and the transparent electrode 28 provided thereon, the interface between the electron injection layer 26 and the semi-transmissive layer 27 provides greater reflection. Therefore, the second reflective surface that forms the resonator structure in the organic light-emitting device according to the present embodiment and is located on the second electrode side with respect to the emission layer will be the interface between the electron injection layer 26 and the semi-transmissive layer 27. The second reflective surface may be formed by providing a semi-transmissive layer or may be formed without providing the semi-transmissive layer. For example, in the case where the light extraction side of the transparent electrode 28 is a gas layer such as air, a large refractive index difference is generated between the transparent electrode and the gas layer. In this case, a resonator can be configured using the interface between the transparent electrode and the gas layer as a second reflective surface.

The transparent electrode 28 has both a function as a cathode and a function as an emitted light extraction electrode. As the transparent electrode 28, a metal oxide conductive film can be used as is the case with the transparent conductive layer 22. The film thickness of the transparent electrode 28 is preferably 10 to 1,000 nm, and more preferably 30 to 300 nm. This is because a balance can be struck between the reduction in a sheet resistance of the electrode and a high optical transmittance. Furthermore, the transparent electrode 28 may be formed by any method, and can be formed, for example, by sputtering.

In the organic light-emitting device of the present embodiment, as illustrated in FIG. 6, the film thickness of the transparent conductive layer 22 is set to vary in one organic light-emitting device such that a first region (A portion) in which the optical path of a resonator structure is relatively small and a second region (B portion) in which the optical path of a resonator structure is relatively large are formed in one and the same light-emitting device. The film thicknesses of the respective organic compound layers, the semi-transmissive layer, and the transparent electrode other than the transparent conductive layer 22 are the same in the one device.

As illustrated in FIG. 6, the film thickness of the transparent conductive layer may be varied partially in one device by any method. For example, a general-purpose lithography technique can be used. In this case, first, the transparent conductive layer is formed at a time so as to have a larger thickness (thickness of B portion) in the entire device. Then, a resist pattern is formed, wet etching is performed using the resist pattern as a mask, and the transparent conductive layer in the A portion is selectively removed so as to have a desired thickness, whereby the film thickness of the transparent conductive layer can be varied in one light-emitting device. Furthermore, in the case of using a general-purpose shadow mask for forming a transparent conductive layer by sputtering, first, the transparent conductive layer is formed at a time so as to have a smaller thickness (thickness of A portion) in the entire device. Then, the portion in which the film thickness of the transparent conductive layer is allowed to remain small (A portion) is covered with a shadow mask, and the transparent conductive layer is formed again by sputtering. Thus, the film thickness of the transparent conductive layer in one device can be varied partially.

Furthermore, in the case of adjusting the optical path by the film thickness of the transparent conductive layer, the optical path can also be adjusted by the presence/absence of the transparent conductive layer. In this case, by designing a mask dimension for patterning the transparent conductive layer to be also required for forming a conventional organic light-emitting device, a portion having the transparent conductive layer and a portion having no transparent conductive layer can be formed in one device. In this case, it is necessary to inject holes from the reflective layer to the organic compound layer. Therefore, in the case where an injection barrier is generated due to a low work function of the reflective layer, a hole injection layer with a film thickness smaller than that of the transparent conductive layer may be provided between the reflective layer and the hole-transporting layer.

Owing to such a procedure, the respective organic compound layers, the semi-transmissive layer, and the transparent electrode are formed at a time after the difference in film thickness of the transparent conductive layer is formed, whereby the organic light-emitting device of the present embodiment can be obtained.

It is preferred that the optical path be adjusted by providing a film thickness difference in the transparent conductive layer as described for the present embodiment, because the film thicknesses of the respective organic compound layers can be made the same in the A portion and in the B portion, and as a result, the driving characteristics become uniform in the entire device.

Further, in the case of adjusting the optical path by the film thickness of the respective organic compound layers instead of the transparent conductive layer, it is preferred that the optical path be adjusted by partly vary the film thickness of a layer having a relatively large carrier mobility, such as the hole-transporting layer and the electron-transporting layer, because the influence on the driving characteristics of the organic light-emitting device is small.

Further, the optical path can also be adjusted by changing the film thicknesses of both of the transparent conductive layer and the organic compound layer(s).

Incidentally, the change in film thickness of the organic compound layer within a device can be effected by adjusting the film thickness partly, using a general-purpose evaporation mask or the like.

Furthermore, in the present embodiment, the description has been made by taking, as an example, the case where two different optical paths are provided in the organic light-emitting device. However, the present invention is not limited to two optical paths in the device. The present invention is also applicable to the case where there are three or more different optical paths in one and the same light-emitting device.

Embodiment 2

Figure 7A:
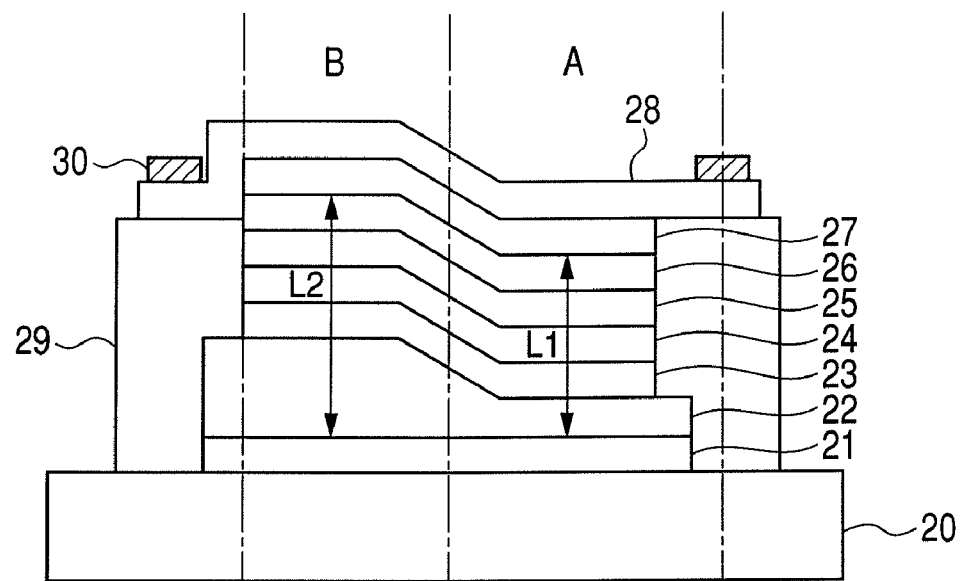
FIGS. 7A and 7B are a schematic cross-sectional view and a schematic plan view of an organic light-emitting device according to Embodiment 2, respectively.
Figure 7B:
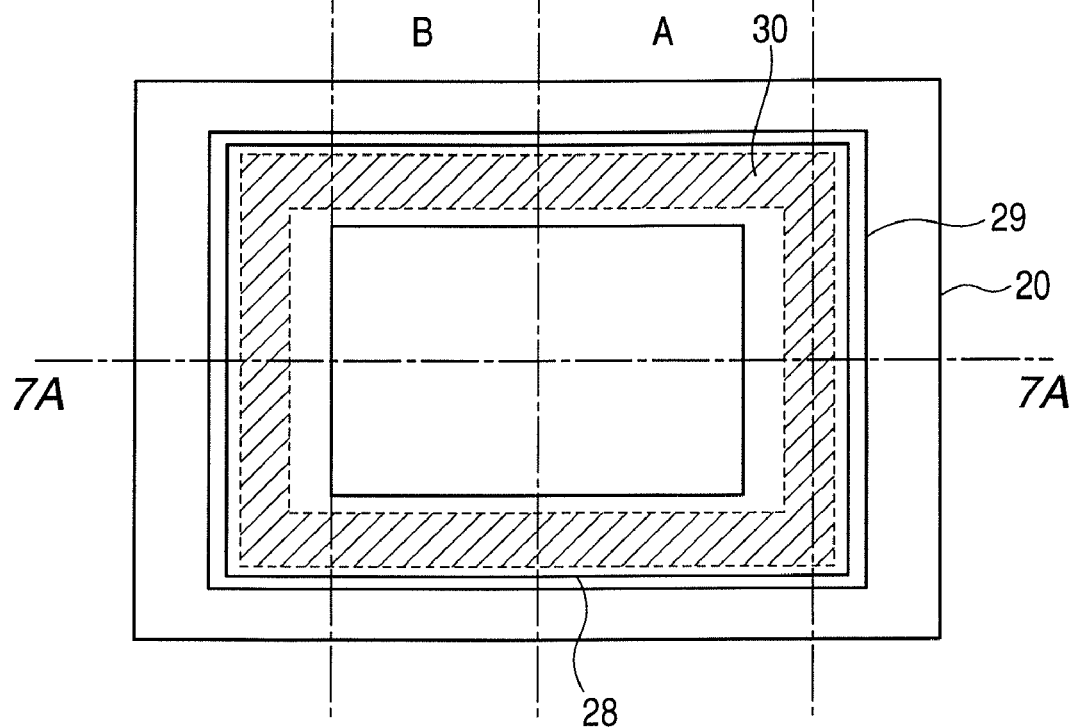

FIGS. 7A and 7B are schematic views illustrating an organic light-emitting device according to Embodiment 2. On a substrate 20, a reflective layer (first electrode) 21, a transparent conductive layer (anode) 22, a hole-transporting layer 23, an emission layer 24, an electron-transporting layer 25, an electron injection layer 26, a semi-transmissive layer 27, and a transparent electrode (second electrode) 28 are successively provided to form an organic light-emitting device. Then, a device separation layer 29 is provided at the periphery of the device, and an auxiliary electrode 30 is provided on the transparent electrode 28 formed on the device separation layer 29. FIG. 7B is a schematic view of the organic light-emitting device of the present embodiment viewed from above, and FIG. 7A is a schematic cross-sectional view taken along line 7A-7A in FIG. 7B.

In the organic light-emitting device of the present invention, a first region in which an optical path is relatively small and a second region in which an optical path is relatively large are provided by changing the film thickness(es) of the transparent conductive layer and/or the organic compound layer(s). In the organic light-emitting device of the present embodiment, in order to form portions with different optical paths in the device, it is necessary to form a difference in the film thickness of, for example, the transparent conductive layer or the organic compound layer. The film thickness difference in this case may depend upon how to adjust the emission characteristics. For example, in the case of applying the resonance condition shown in Table 4, the film thickness difference of the transparent conductive layer is 110 nm. When such a large film thickness difference is formed in such a device, stepped cut may occur in the organic compound layer or the transparent electrode 28. In particular, when the transparent electrode 28 in the upper portion is electrically disconnected in the device, there may be posed a problem such that one of the first region and the second region cannot be driven, for example.

Therefore, in the present embodiment, the auxiliary electrode connecting the first and the second regions electrically is provided. Thus, even in the case where stepped cut occurs in the transparent electrode 28 to disenable electrical connection, electrical connection to any one of the first region and the second region can be attained through the auxiliary electrode 30. As the device separation layer 29, an insulating resin material or an inorganic insulating material can be used. For example, acrylic resin, polyimide resin, silicon nitride, or the like can be used. As the auxiliary electrode 30, a material with a relatively low resistance is preferably used, and for example, a metal such as aluminum, silver, or zinc, or an alloy thereof can be used.

Embodiment 3

A display apparatus of the present embodiment includes a plurality of pixels each composed of an organic light-emitting device and a driving circuit for controlling light emission of each pixel, in which at least one pixel is composed of the organic light-emitting device of the present invention. Moreover, portions with different optical paths are provided in pixel(s) that emits light of at least one color, and the optical paths and resonant wavelengths thereof are set so as to satisfy the relationship of Equation 3.

Figure 8:
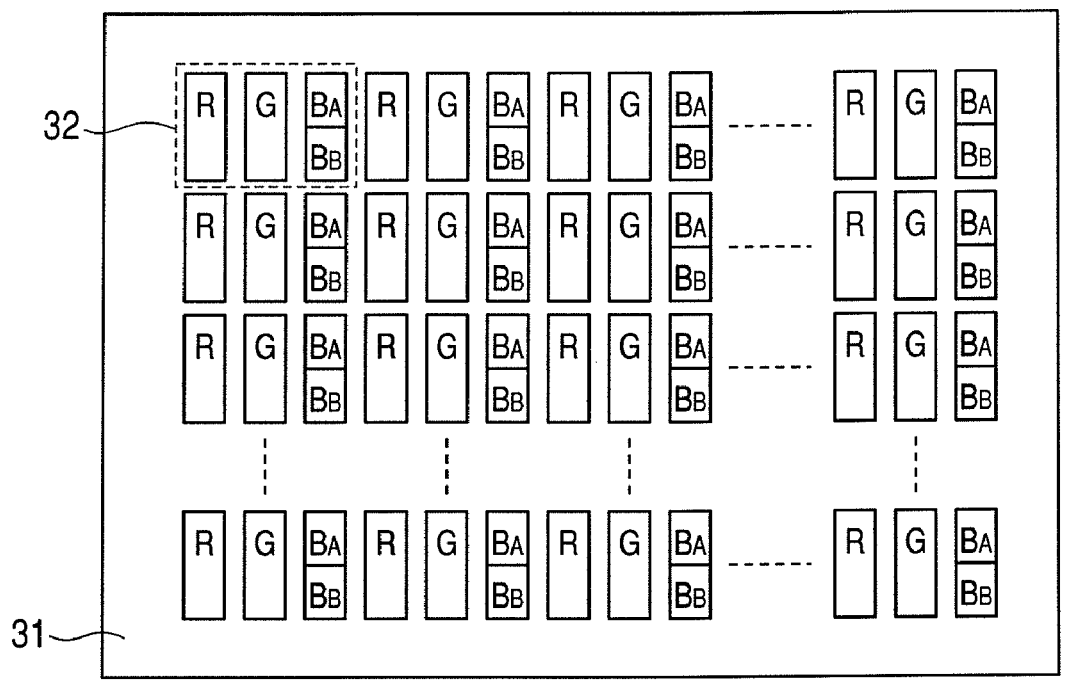
FIG. 8 is a schematic plan view of a display apparatus according to Embodiment 3.

FIG. 8 is a schematic view of an exemplary display apparatus of the present embodiment viewed from above, in which portions with different optical paths are provided only in blue-light-emitting pixels of red-, green-, and blue-light-emitting pixels. A plurality of pixel units 32 are arranged in a matrix pattern in a display region 31, and each pixel unit is composed of a red-light-emitting pixel R, a green-light-emitting pixel G, and a blue-light-emitting pixel B. In the bluelight-emitting pixel B, a region BA in which the optical path for resonating light emitted from the emission layer is relatively small and a region BB in which the optical path is relatively large are provided.

Incidentally, the term "pixel" herein employed refers to a minimum unit capable of controlling light emission independently. Moreover, the term "pixel unit" herein employed refers to a minimum unit that is composed of a plurality of pixels with different emission colors and that enables light emission of a desired color by mixing colors of the respective pixels.

In the present embodiment, all the pixels may be the organic light-emitting devices of the present invention, or only some pixels may be the organic light-emitting devices of the present invention. That is, the display apparatus may include both the organic light-emitting devices of the present invention and conventional organic light-emitting devices. In this case, by adjusting the combination ratio of the both kinds of devices, the emission characteristics of the display apparatus can be adjusted.

Further, in the case where the display apparatus includes both the organic light-emitting devices of the present invention and the conventional light-emitting devices, the organic light-emitting devices of the present invention and the conventional organic light-emitting devices may be arranged regularly or the organic light-emitting devices of the present invention may be disposed irregularly.

Furthermore, in the present embodiment, as the pixels including the organic light-emitting devices of the present invention, pixels exhibiting any emission colors are applicable. It is preferred that the organic light-emitting devices constituting the pixels exhibiting blue light emission of the display apparatus be the organic light-emitting devices of the present invention, because light emission having high color purity and satisfactory viewing angle characteristics is obtained.

Embodiment 4

A display apparatus of the present embodiment includes a plurality of pixels each composed of an organic light-emitting device. Each of the organic light-emitting devices has a general device configuration such as illustrated in FIG. 2. Furthermore, first pixels in which the optical path for resonating light emitted by the emission layer is relatively small and second pixels in which the optical path is relatively large are provided. That is, in the display apparatus of the present embodiment, pixels with different emission characteristics can be driven independently of each other.

In addition, the optical path of the resonator structure in the first pixel is set so as to satisfy Equation 3(1) and the optical path of the resonator structure in the second pixel is set so as to satisfy Equation 3(2) and Equation 3(3).

For at least one kind of emission color of the emission colors of the pixels constituting the pixel units, there are provided pixel units each including the first pixel in which the relationship between the optical path and the resonant wavelength satisfies Equation 3(1) and pixel units each including the second pixel in which the relationship between the optical path and the resonant wavelength satisfies Equation 3(2) and Equation 3(3). Consequently, a display apparatus having excellent emission characteristics at the front and wide viewing angle characteristics can be realized.

Figure 9:
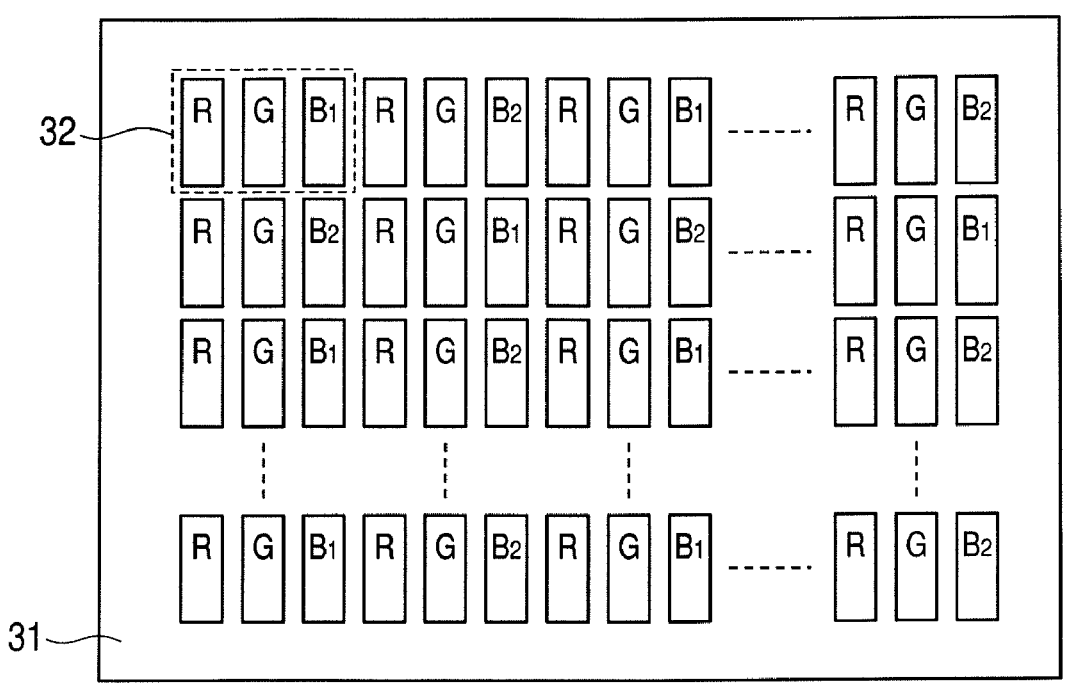
FIG. 9 is a schematic plan view of a display apparatus according to Embodiment 4.

FIG. 9 is a schematic view of an exemplary display apparatus of the present embodiment viewed from above, in which first pixels and second pixels with different optical paths are provided only in blue-light-emitting pixels of red-, green-, and blue-light-emitting pixels. A plurality of pixel units 32 are arranged in a matrix pattern in a display region 31, and each pixel unit is composed of a red-light-emitting pixel R, a green-light-emitting pixel G, and a blue-light-emitting pixel B. The pixel units 32 include pixel units each including a pixel $B_1$ in which the optical path for resonating light emitted by the emission layer is relatively small and pixel units each including a pixel $B_2$ in which the optical path is relatively large. Then, the light emissions of the red-light-emitting pixel R, green-light-emitting pixel G, and blue-light-emitting pixels $B_1$ and $B_2$ are controlled by a driving circuit of each pixel.

Furthermore, when the pixel $B_1$ and the pixel $B_2$ are respectively disposed in adjacent pixel units, the viewing angle characteristics are compensated between the adjacent pixel units, and the emission colors at the front are the same, and hence an apparatus with satisfactory display performance can be realized. In particular, it is preferred that such arrangement be applied to a display apparatus with a high resolution having a small distance between adjacent pixel units, because the difference between the adjacent pixel units are unlikely to be recognized. Further, it is preferred that the pixel units having the pixel $B_1$ and the pixel units having the pixel $B_2$ be disposed alternately in longitudinal and lateral directions, because the viewing angle characteristics are compensated over the entire display region.

Incidentally, in the case of varying the optical path in different pixels such as the first pixel and the second pixel in the present embodiment, it is also possible to vary the optical path by providing one pixel with a transparent conductive layer and not providing the other pixel with the transparent conductive layer.

Furthermore, in the present embodiment, the first pixel in which the optical path for resonating light emitted by the emission layer is relatively small and the second pixel in which the optical path is relatively large are applicable to pixels exhibiting any emission color and may be applied to pixels of all the emission colors. In particular, it is preferred that the first and the second pixels be applied to those which are formed of organic light-emitting devices in which the resonant wavelength is required to be set to be on a side of a wavelength shorter than the peak wavelength of the PL spectrum of the emission layer due to the requirement of emission chromaticity. It is more preferred that the organic light-emitting devices constituting the pixels exhibiting blue-light emission of the display apparatus be the organic light-emitting devices of the present invention, because light emission with high color purity and satisfactory viewing angle characteristics is obtained.

Herein, when the display apparatus is viewed visually from the front in the case where the first and the second pixels are driven at the same current value, the orders of optical interference are different although the resonant wavelengths thereof are the same, and hence the front luminance becomes higher in the first pixel than in the second pixel, which is not preferred because this is recognized as luminance unevenness or flickering of the display surface. Therefore, in the present embodiment, in the case where the first and the second pixels are allowed to emit light at the same front luminance, it is preferred that the value of a current supplied to the second pixel be set to be larger than that of a current supplied to the first pixel.

In order to make the value of a current supplied to the first pixel different from the value of a current supplied to the second pixel, there is a method of converting a video signal which is input to each pixel. Alternatively, there is a method of varying a driving circuit for each pixel or pixel unit previously, thereby varying the value of an output current supplied to an organic light-emitting device from the circuit.

Figure 10:
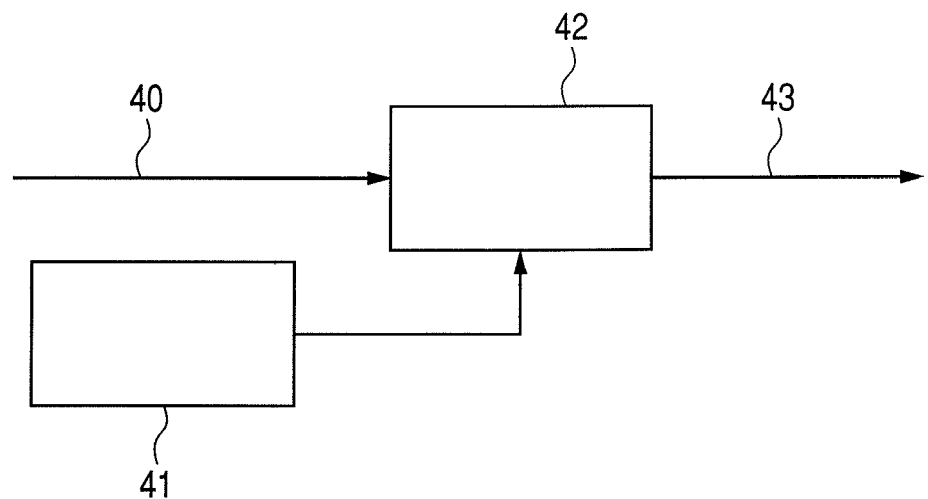
FIG. 10 is a block diagram illustrating a method of converting a video signal.

There is no particular limitation to a method of converting a video signal to compensate for the luminance difference among the respective pixels, and any method is available. For example, it is possible to use a method of combining a means for storing the disposition of the first pixel and the second pixel and the information on emission characteristics and a means for correcting a video signal in accordance with the difference in emission characteristics of respective pixels. FIG. 10 is a block diagram illustrating an exemplary method of converting a video signal by a combination of the storage means and the correction means. In FIG. 10, reference numeral 40 denotes a video signal; 41, storage means; 42, correction means; and 43, a correction video signal, respectively. The video signal 40 supplied to a switching device controlling the light emission of the first pixel or the video signal 40 supplied to a switching device controlling the light emission of the second pixel is corrected by the correction means 42 based on the information stored in the storage means 41 and is output as the correction video signal 43.

There is no particular limitation to the method of varying a driving circuit to compensate for the luminance difference in respective pixels, and any method is available. For example, the ratio between the channel width and the channel length of a TFT used in the driving circuit may be adjusted such that a larger driving current is supplied to the second pixel, compared with that of the first pixel. Further, in the case of a current-mirror type pixel circuit, the mirror ratio of the circuits can also be varied between the first and the second pixels to adjust the value of a driving current supplied to the pixels.

Further, as another procedure for compensating for the luminance difference among the respective pixels, the areas of the pixels may be adjusted. In this case, the area of the first pixel that can be expected to have higher luminance is set to be smaller than that of the second pixel such that the emission intensity of the first pixel is the same as that of the second pixel.

Embodiment 5

A display apparatus of the present embodiment includes a plurality of pixels each comprised of an organic light-emitting device. Each of the organic light-emitting devices has a general device configuration such as illustrated in FIG. 2. Furthermore, the display apparatus has a plurality of pixel units each having a plurality of pixels with different emission colors, and for at least one color of the emission colors, there are provided a first pixel in which the optical path for resonating light emitted by the emission layer is relatively small and a second pixel in which the optical path is relatively large.

Moreover, the optical path of the resonator structure in the first pixel is set so as to satisfy Equation 3(1) and the optical path of the resonator structure in the second pixel is set so as to satisfy Equation 3(2) and Equation 3(3).

For at least one kind of emission color of the emission colors of the pixels constituting the pixel units, each of the respective pixel units has the first pixel in which the relationship between the optical path and the resonant wavelength satisfies Equation 3(1) and the second pixel in which the relationship between the optical path and the resonant wavelength satisfies Equation 3(2) and Equation 3(3). Consequently, a display apparatus having excellent emission characteristics at the front and wide viewing angle characteristics can be realized.

In the present embodiment, excellent emission characteristics and wide viewing angle characteristics can be obtained in each pixel unit, and hence more minute display can be performed compared with that in Embodiment 4.

Figure 11:
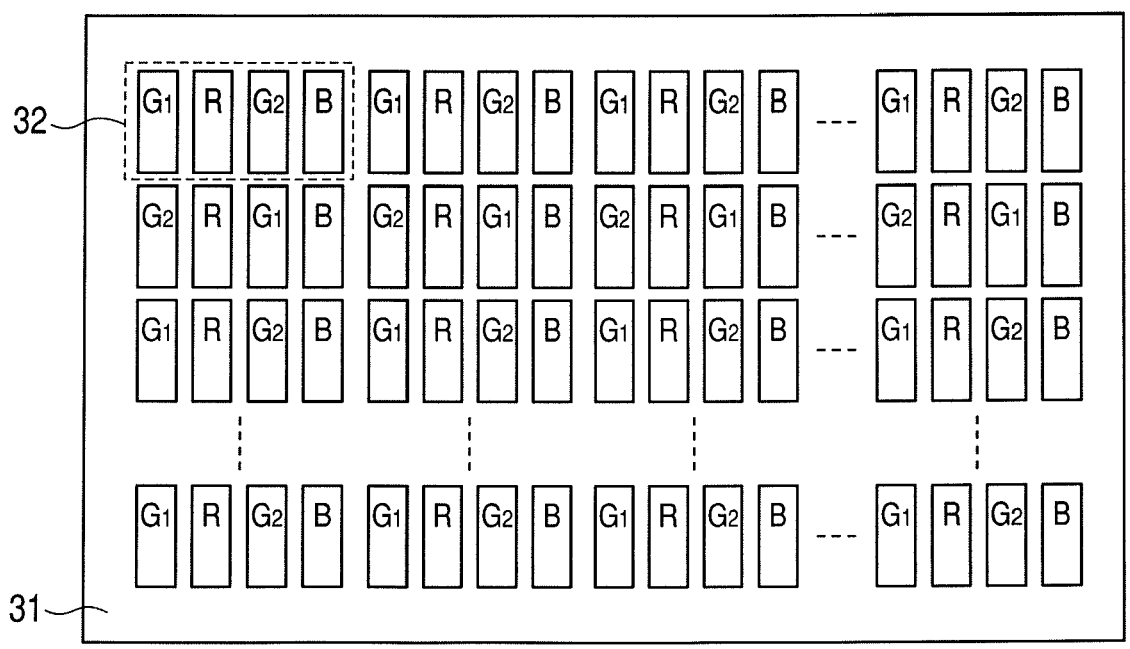
FIG. 11 is a schematic plan view of a display apparatus according to Embodiment 5.

FIG. 11 is a schematic view of an exemplary display apparatus of the present embodiment viewed from above, in which the first pixel and the second pixel with different optical paths are provided only in the green-light-emitting pixel of the red-, green-, and blue-light-emitting pixels. A plurality of pixel units 32 are arranged in a matrix pattern in a display region 31. Moreover, each pixel unit is composed of a red-light-emitting pixel R, a blue-light-emitting pixel B, a green-light-emitting pixel $G_1$ in which the optical path for resonating light emitted by the emission layer is relatively small, and a green-light-emitting pixel $G_2$ in which the optical path is relatively large. The light emissions of the red-light-emitting pixel R, the blue-light-emitting pixel B, and the green-light-emitting pixels $G_1$, $G_2$ are controlled by the driving circuit of each pixel.

As illustrated in FIG. 11, two pixels with different optical paths for resonating the light emitted from the emission layer are provided in green-light-emitting pixels having a highest luminous efficiency among red-, green-, and blue-light-emitting pixels, whereby viewing angle characteristics can be enhanced more effectively.

The green-light-emitting pixel $G_1$ and the green-light-emitting pixel $G_2$ may be disposed distant from each other as illustrated in FIG. 11, or may be placed adjacent to each other. It is preferred that the green-light-emitting pixels $G_1$ and $G_2$ be disposed distant from each other because the spatial frequency is increased, and the resolution looks higher to the human eye. In the case where the green-light-emitting pixels $G_1$ and $G_2$ are disposed adjacent to each other, they may be disposed with a member such as a device separation layer or the like disposed therebetween, or may be disposed adjacent to each other.

The green-light-emitting pixels $G_1$ and $G_2$ may not be allowed to emit light at the same front luminance. However, when the green-light-emitting pixels $G_1$ and $G_2$ are allowed to emit light at the same front luminance, better emission characteristics and wider viewing angle characteristics can be obtained at the front. As a method of compensating for the difference in front luminance of the green-light-emitting pixels $G_1$ and $G_2$, the same method as described for Embodiment 4 can be used.

The display apparatus of the present invention has been described by way of embodiments. The display apparatus of the present invention can be applied to various uses such as illumination, a display of electronic equipment, and a backlight for a display system. Examples of the display of electronic equipment include displays of a television receiver and a personal computer, a back surface display portion of an imaging apparatus, a display portion of a mobile phone, and a display portion of a portable game machine. Other examples include a display portion of a portable audio player, a display portion of a personal digital assistant (PDA), and a display portion of a car navigation system.

EXAMPLES

Hereinafter, the present invention is described in detail by way of examples with reference to the drawings. However, the present invention is not limited thereto.

Example 1

Figure 12:
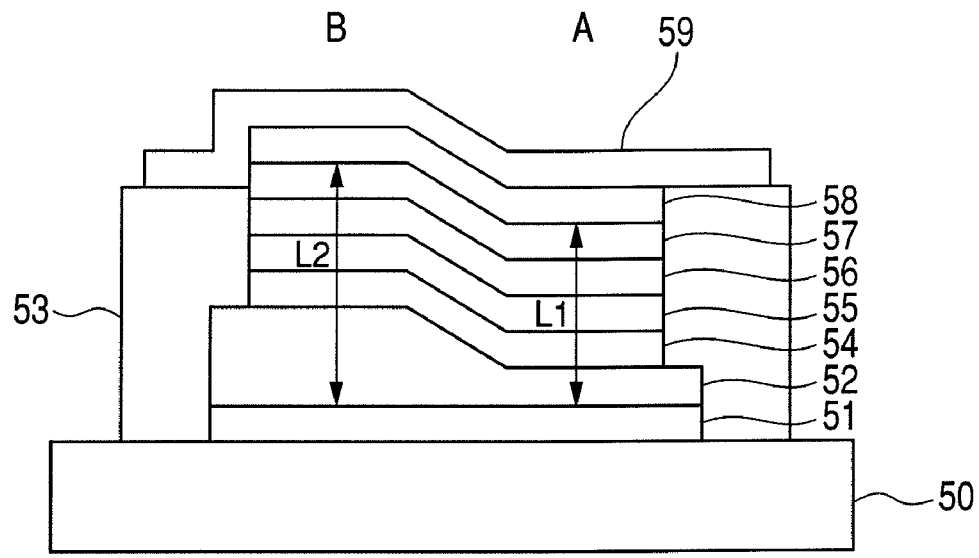
FIG. 12 is a schematic cross-sectional view of an organic light-emitting device according to Example 1.

The present example corresponds to the display apparatus according to Embodiment 1. An organic light-emitting device illustrated in FIG. 12 was produced by the procedure described below.

A film of an aluminum alloy (AlNd) was formed on a substrate 50 in a thickness of about 100 nm as a reflective layer 51 by a sputtering process, and a film of ITO was formed in a thickness of 184 nm thereon as a transparent conductive layer (anode) 52 by a sputtering process. After that, a resist pattern was formed on the transparent conductive layer 52. At this time, the resist pattern was formed so as to occupy 50% of the aperture area of the organic light-emitting device. Then, using the resist pattern as a mask, the transparent conductive layer 52 in the portion where the resist pattern was not formed was removed selectively by dry etching so as to have a thickness of 74 nm. Thus, in the organic light-emitting device of the present invention, the portion in which the film thickness of the transparent conductive layer was 74 nm and the portion in which the film thickness of the transparent conductive layer was 184 nm were present in one and the same light-emitting device. Further, a device separation layer 53 was formed with an acrylic resin, whereby a substrate was produced. The resultant is subjected to ultrasonic cleaning with isopropyl alcohol (IPA). Next, the resultant was washed with boiled water and dried. Further, the resultant was cleaned with UV/ozone before organic compounds were formed into films by vacuum evaporation.

First, a film of Compound (I) represented by the below-mentioned structural formula is formed in a thickness of 52 nm as a hole-transporting layer 54. At this time, the degree of vacuum was $1\times10^{-4}$ Pa and the deposition rate was 0.2 nm/sec.

Compound (I)

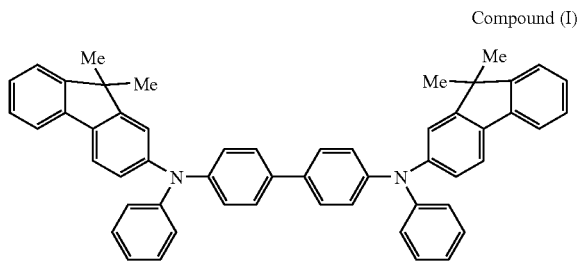

Then, a blue-light emission layer 55 exhibiting the PL spectrum illustrated in FIG. 2 was formed into a film having a thickness of 36 nm by a vacuum evaporation process. The degree of vacuum during the evaporation was $1\times10^{-4}$ Pa and the deposition rate was 0.2 nm/sec.

Furthermore, bathophenanthroline (Bphen) was formed into a film having a thickness of 10 nm by a vacuum evaporation process as an electron-transporting layer 56. The degree of vacuum during the evaporation was $1\times10^{-4}$ Pa and the film formation rate was 0.2 nm/sec.

Then, Bphen and $Cs_2CO_3$ were coevaporated (at a weight ratio of 90:10) to form an electron injection layer 57 having a thickness of 64 nm. The degree of vacuum during the evaporation was $3\times10^{-4}$ Pa and the film formation rate was 0.2 nm/sec.

Subsequently, silver was formed into a film having a thickness of 10 nm by a vacuum evaporation process as a semitransmissive layer 58. The degree of vacuum during the evaporation was $1\times10^{-4}$ Pa and the film formation rate was 0.2 nm/sec.

Then, the substrate after the formation of the electron injection layer was transferred to a sputtering system without breaking the vacuum, and ITO was formed into a film having a thickness of 34 nm as a transparent electrode 59, thereby obtaining the organic light emitting device.

Table 10 collectively shows the emission efficiencies, chromaticity coordinates, and full width at half maximums of emission spectrum of the sites of the thus obtained organic light-emitting device in which the film thickness of the transparent conductive layer varies and of the whole device as the combination thereof. Furthermore, FIG. 5 illustrates a change in relative luminance depending upon viewing angle of each of the sites and the whole device.

TABLE 10

Emission efficiency, chromaticity coordinates, full width at half maximum of emission spectrum

| | Emission efficiency (cd/A) | Chromaticity coordinates | | Full width at half maximum of emission spectrum |
|---|---|---|---|---|
| | | CIEx | CIEy | |
| Transparent conductive layer 74 nm | 2.3 | 0.134 | 0.091 | 50 nm |
| Transparent conductive layer 184 nm | 1.4 | 0.157 | 0.083 | 35 nm |
| Combined emitted light | 3.7 | 0.143 | 0.088 | 50 nm |

As described above, in the organic light-emitting device of the present invention, the film thickness of the transparent conductive layer is varied in one light-emitting device. However, since the enhancement wavelengths by resonance at the front are brought into conformity with each other, the difference in emission chromaticity exhibited by the respective sites is small, and it can be said that the emission colors are identical to each other practically. Furthermore, as can be seen from FIG. 5, the viewing angle characteristics show a profile that varies locally depending upon the film thickness of the transparent conductive layer; however, the viewing angle characteristics of the whole device as the combination of the respective sites are approximately the same as those of a Lambertian light source. Thus, the luminance can be visually recognized to be equal when viewed at any angle. That is, the organic light-emitting device can be said to have wide viewing angle characteristics.

Comparative Example 1

In Comparative Example 1, a change in relative luminance due to viewing angle is brought close to that of a Lambertian light source in an organic light-emitting device in which the film thickness of the transparent conductive layer in the device is set to be uniform, with no thickness difference being formed.

Figure 13:
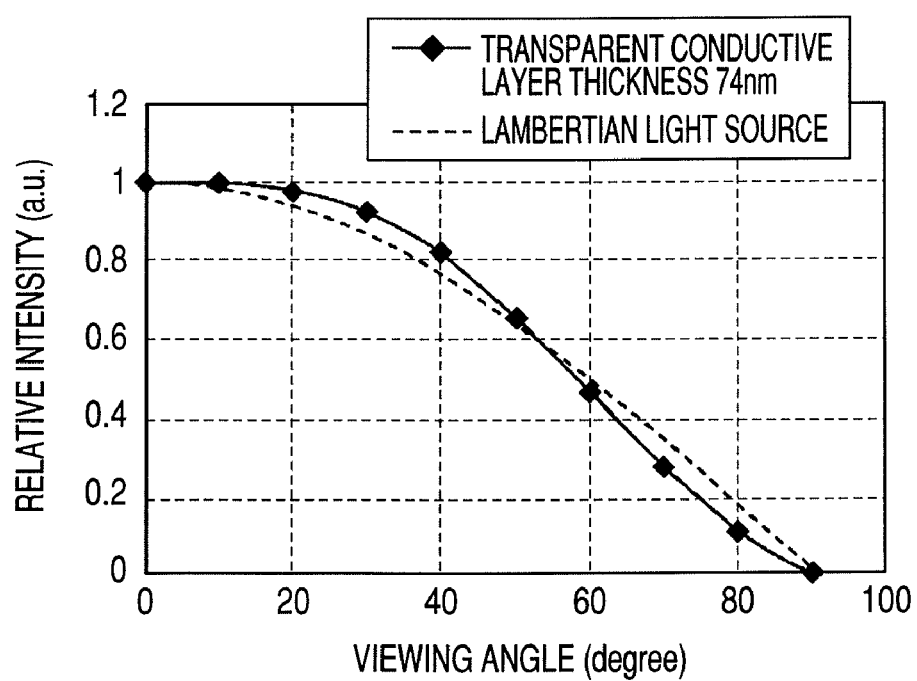
FIG. 13 is a graphical representation illustrating a viewing angle vs. relative luminance profile of an organic light-emitting device according to Comparative Example 1.

An organic light-emitting device was produced by following the same procedure as in Example 1 with the exception that the transparent conductive layer was formed in a uniform thickness of 74 nm and the film thickness of the hole-transporting layer was set to be 98 nm. Table 11 shows the optical path and resonant wavelength of the light-emitting device of Comparative Example 1, and Table 12 shows the emission efficiency, chromaticity coordinates, and full width at half maximum of emission spectrum of the light-emitting device of Comparative Example 1. Furthermore, FIG. 13 illustrates a change in relative luminance profile due to viewing angle of the device.

TABLE 11

Optical path and resonant wavelength

|  |  | Film thickness of transparent conductive layer 74 nm |
|---|---|---|
| Optical path |  | 590 nm |
| Resonant wavelength | Order m = 1 | 961 nm |
|  | Order m = 2 | 529 nm |
|  | Order m = 3 | 365 nm |

TABLE 12

Emission efficiency, chromaticity coordinates, full width at half maximum of emission spectrum

|  | Emission efficiency (cd/A) | Chromaticity coordinates | | Full width at half maximum of emission spectrum |
|---|---|---|---|---|
|  |  | CIEx | CIEy |  |
| Transparent conductive layer 74 nm | 6.5 | 0.124 | 0.327 | 60 nm |

It can be seen from FIG. 13 that the viewing angle vs. relative luminance profile of the organic light-emitting device of Comparative Example 1 exhibits characteristics approximately similar to those of a Lambertian light source, and therefore that the luminance changes of the organic light-emitting device is small when viewed at any angle. However, the emission characteristics, in particular, the emission chromaticity CIEy coordinate is more than 0.3, which shows bluish white (sky blue) light emission. Moreover, the full width at half maximum of emission spectrum is larger than that of the device of Example 1, and the color purity of the light-emitting device of Comparative Example 1 is low.

Incidentally, the emission efficiency of the organic light-emitting device of the present comparative example is 6.5 cd/A, which is about twice that of the light-emitting device of Example 1. The reason for this is that as can also be seen from the large value of the chromaticity CIEy coordinate, the peak wavelength of EL spectrum of the device of Comparative Example 1 is shifted to a longer wavelength, whereby the luminous efficiency increases. Even in the organic light-emitting device of the present invention described in Example 1, the emission efficiency can be improved using similar effects, by setting the peak wavelength of EL spectrum in a wavelength region where the luminous efficiency is high.

Comparative Example 2

An organic light-emitting device was produced by following the same procedure as in Example 1 with the exception that the film thickness of the transparent conductive film to be 74 nm and 100 nm in one device. Table 13 illustrates the optical path and resonant wavelength of the organic light-emitting device of Comparative Example 2.

TABLE 13

Optical path and resonant wavelength

|  |  | Film thickness of transparent conductive layer | |
|---|---|---|---|
|  |  | 74 nm | 100 nm |
| Optical path |  | 489 nm | 540 nm |
| Resonant wavelength | Order m = 1 | 798 nm | 880 nm |
|  | Order m = 2 | 440 nm | 485 nm |
|  | Order m = 3 | 303 nm | 335 nm |

In this Comparative Example 2, when the two kinds of film thicknesses of the transparent conductive layer are set as mentioned above, the optical paths thereof become 489 nm and 540 nm, respectively, which means that when compared with the average value of 515 nm of the optical paths, the optical path is set to be shorter or longer by about 5%. There is a difference between the resonant wavelengths at all the orders, and in the case of the order m of 2, which is the same as that is Example 1, there is a difference of 45 nm.

Figure 14:
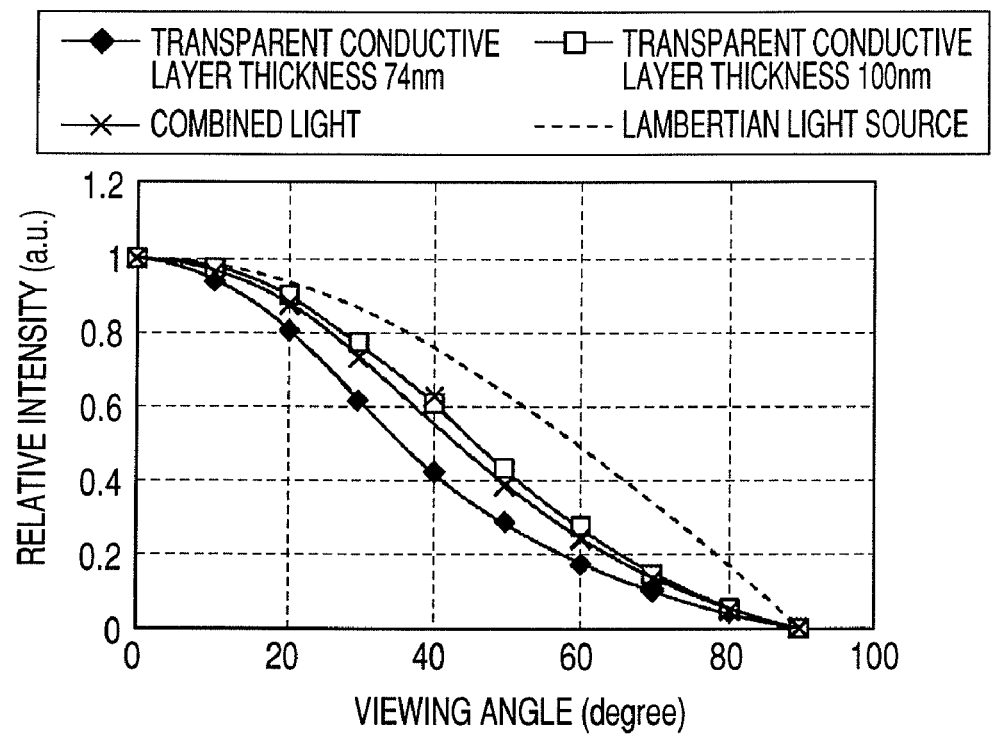
FIG. 14 is a graphical representation illustrating a viewing angle vs. relative luminance profile of an organic light-emitting device according to Comparative Example 2.

Table 14 collectively shows the emission efficiencies, chromaticity coordinates, and full width at half maximums of emission spectrum of the sites of the thus obtained organic light-emitting device in which the film thickness of the transparent conductive layer varies and of the whole device as the combination thereof. Furthermore, FIG. 14 illustrates a change in relative luminance depending upon viewing angle of each of the sites and the whole device.

TABLE 14

Emission efficiency, chromaticity coordinates, and full width at half maximum of emission spectrum

|  | Emission efficiency (cd/A) | Chromaticity coordinates | | Full width at half maximum of emission spectrum |
|---|---|---|---|---|
|  |  | CIEx | CIEy |  |
| Transparent conductive layer 74 nm | 2.3 | 0.134 | 0.091 | 50 nm |
| Transparent conductive layer 100 nm | 5.9 | 0.112 | 0.219 | 60 nm |
| Combined emitted light | 8.2 | 0.123 | 0.157 | 60 nm |

In the organic light-emitting device of Comparative Example 2, there is a difference in resonant wavelength of 45 nm at the order m of 2, and the chromaticity varies remarkably even in the same light-emitting device. In particular, there is a difference of 0.128 in the CIEy-value of the chromaticity coordinate, and the chromaticity shift is large, which is unacceptable as the same emission color, so that there is posed a problem in color irregularity from the practical point of view.

Furthermore, as can be seen from FIG. 14, the viewing angle characteristics show a profile in any film thickness of the transparent conductive layer, in which the luminance decreases monotonously with the increase in the viewing angle. This also applies to that of the combined emitted light, and in particular, the emitted light is found to be dark when the organic light-emitting device is viewed visually at a certain angle.

Incidentally, even in the light-emitting device of Comparative Example 2, the emission efficiency of the combined emitted light is large. This is attributable to the influence of the luminous efficiency involved in the change in emission chromaticity as is the case with Comparative Example 1 above. Even in the light-emitting device of Example 1, the emission efficiency can be improved by setting of such emission chromaticity coordinates.

Example 2

The present example corresponds to the display apparatus according to Embodiment 5. The display apparatus includes a plurality of organic light-emitting devices that emit red, green, and blue lights as pixels, and two blue-light-emitting pixels are provided in one light-emitting pixel unit. That is, one pixel unit is composed of four pixels in total of three colors, including a red-light-emitting pixel, a green-light-emitting pixel, a first blue-light-emitting pixel, and a second blue-light-emitting pixel. The two blue-light-emitting pixels are set to have optical paths different from each other.

Figure 15:
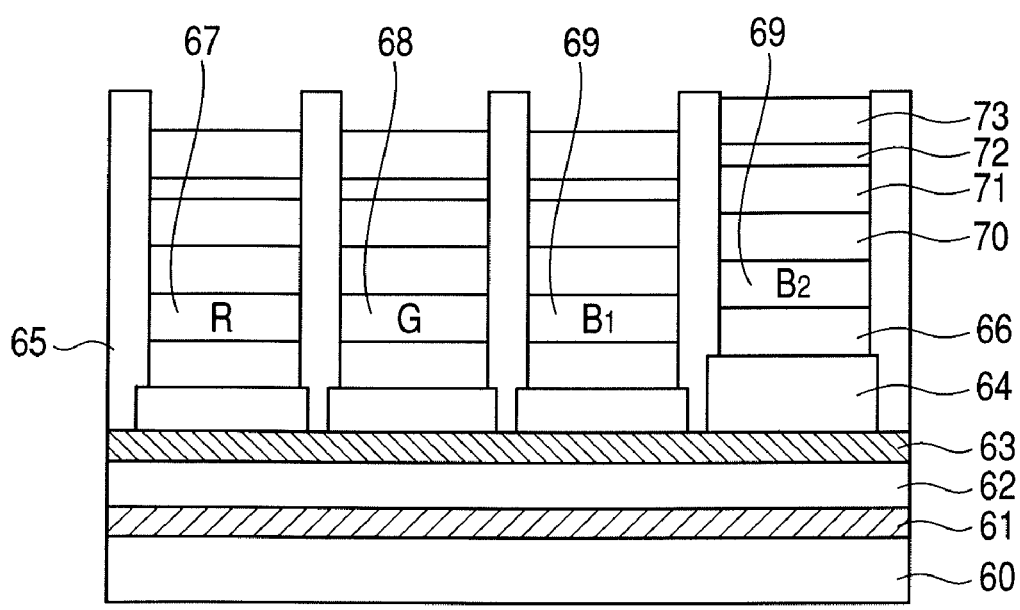
FIG. 15 is a schematic cross-sectional view of a display apparatus according to Example 2.

FIG. 15 is a schematic cross-sectional view illustrating one pixel unit of the display apparatus of the present invention, produced by the following procedure.

On a glass substrate 60 as a support, a TFT driving circuit 61 made of low-temperature polysilicon was formed, and a planarizing layer 62 made of an acrylic resin was formed thereon, whereby a substrate was obtained. An aluminum alloy (AlNd) was formed thereon in a thickness of about 100 nm as a reflective layer 63 by a sputtering process, followed by patterning.

Then, an ITO film as a transparent conductive layer 64 was formed in a uniform thickness of 74 nm for all the light-emitting pixels by a sputtering process. After that, in the region corresponding to the second blue-light-emitting pixel, an ITO as a transparent conductive film was additionally formed in a thickness of 110 nm by use of a shadow mask. Subsequently, the transparent conductive film was patterned for the respective pixels, whereby an anode was formed.

Furthermore, a device separation layer 65 was formed of an acrylic resin, whereby a substrate was produced. The resultant was ultrasonically cleaned with isopropyl alcohol (IPA), and then washed with boiled water and dried. After that, the resultant was cleaned with UV/ozone before organic compounds were formed into films by vacuum evaporation.

First, as a hole-transporting layer 66 common to all the pixels, Compound (I) represented by the below-mentioned structural formula was formed into a film in all pixels. At that time, the degree of vacuum was $1\times10^{-4}$ Pa and the deposition rate was 0.2 nm/sec.

(Compound I)

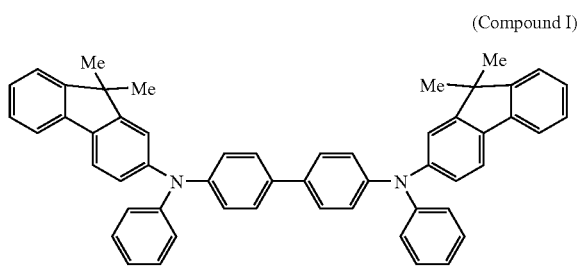

Figure 16:
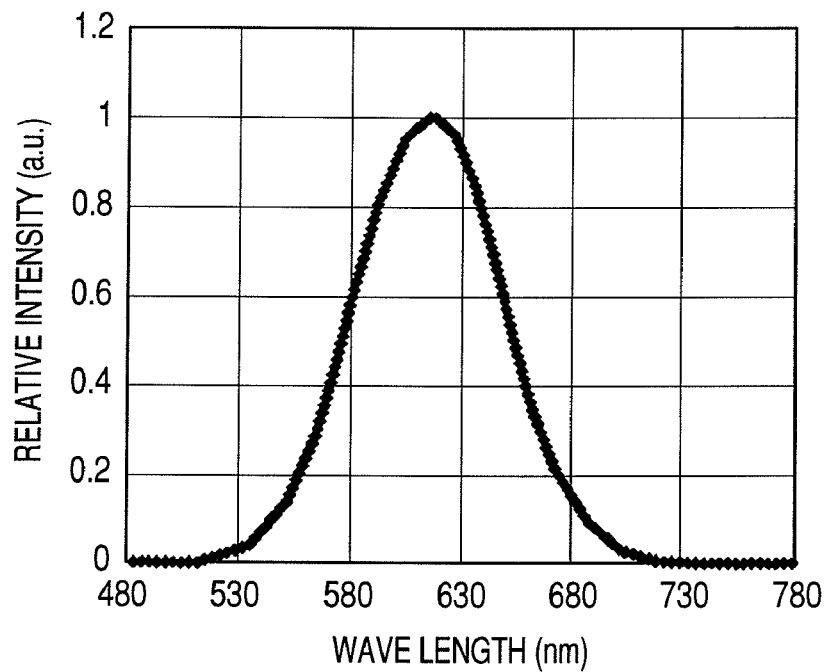
FIG. 16 is a graphical representation illustrating a PL spectrum of a red emission layer used in the display apparatus according to Example 2.
Figure 17:
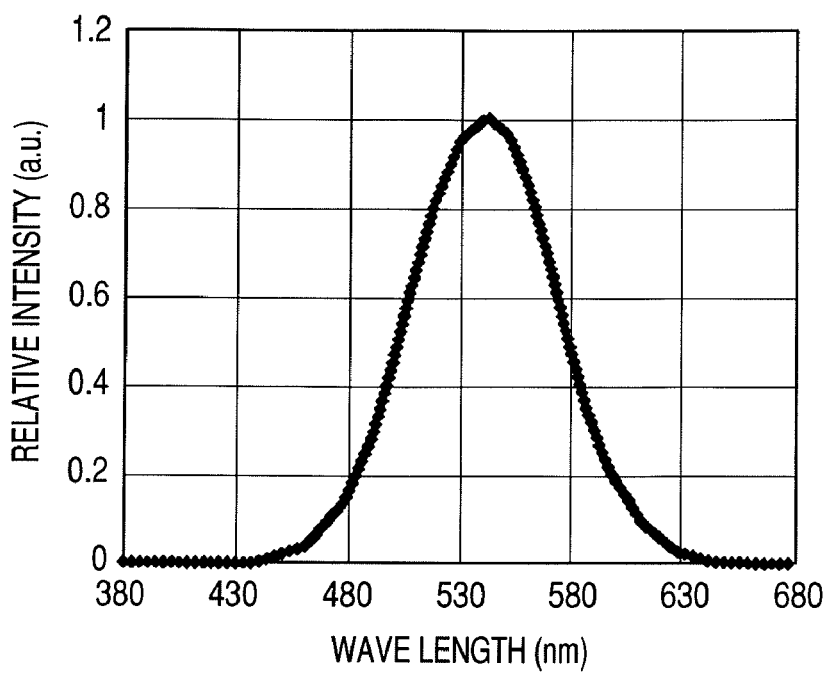
FIG. 17 is a graphical representation illustrating a PL spectrum of a green emission layer used in the display apparatus according to Example 2.

Next, an emission layer for each of red, green, and blue colors was formed by use of a shadow mask. As a red-light-emitting layer, an emission layer 67 exhibiting a PL spectrum illustrated in FIG. 16 was formed. As a green-light-emitting layer, an emission layer 68 exhibiting a PL spectrum illustrated in FIG. 17 was formed. As blue-light-emitting layers, emission layers 69 exhibiting a PL spectrum illustrated in FIG. 3 were formed.

Furthermore, as an electron-transporting layer 70 common to all the pixels, Bathophenanthroline (Bphen) was formed into a film by a vacuum evaporation process. The degree of vacuum during the evaporation was $1\times10^{-4}$ Pa and the film formation rate was 0.2 nm/sec.

Then, as an electron injection layer 71 common to all the pixels, Bphen and $Cs_2CO_3$ were coevaporated (at a weight ratio of 90:10). The degree of vacuum during the evaporation was $3\times10^{-4}$ Pa and the deposition rate was 0.2 nm/sec.

Subsequently, as a semi-transmissive layer 72 common to all the pixels, a silver film was formed by a vacuum evaporation process. The degree of vacuum during the evaporation was $1\times10^{-4}$ Pa and the deposition rate was 0.2 nm/sec.

Next, the substrate after the formation of the semi-transmissive layer was transferred to a sputtering system without breaking the vacuum. An ITO film was formed as a transparent electrode 73 common to all the pixels, whereby a display apparatus was obtained.

Table 15 shows collectively the film thicknesses of the transparent conductive layer, organic compound layer, semi-transmissive layer, and transparent electrode of the respective pixels of the thus obtained display apparatus.

TABLE 15

| Film thickness of respective layers | | | | |
|---|---|---|---|---|
| | Red-light-emitting pixel | Green-light-emitting pixel | First blue-light-emitting pixel | Second blue-light-emitting pixel |
| Transparent electrode | | | 34 nm | |
| Semi-transmissive layer | | | 10 nm | |
| Electron injection layer | | | 64 nm | |
| Electron-transporting layer | | | 10 nm | |
| Emission layer | 50 nm | 50 nm | | 36 nm |
| Hole-transporting layer | 114 nm | 110 nm | | 50 nm |
| Transparent conductive layer | | | 74 nm | 184 nm |
| Reflective layer | | | 100 nm | |

Figure 18:
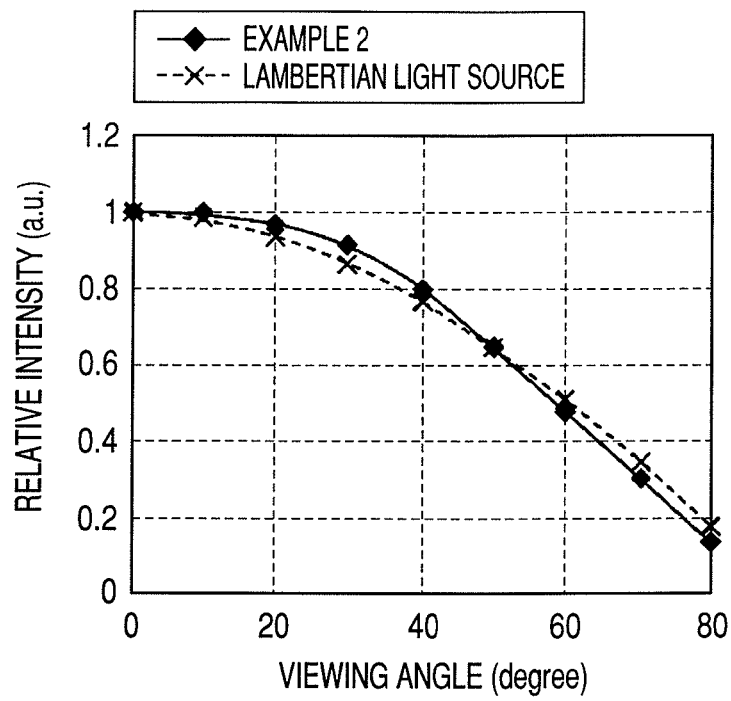
FIG. 18 is a graphical representation illustrating a viewing angle vs. relative luminance profile of the display apparatus according to Example 2.

Table 18 shows the color reproduction range (NTSC ratio) and the viewing angle color shift amount of the display apparatus thus obtained. Furthermore, FIG. 18 illustrates a change in relative luminance depending upon viewing angle in the case where a white color (chromaticity coordinates: 0.32, 0.33; luminance: $cd/m^2$) is displayed in the display apparatus. The term "viewing angle color shift amount δ" herein employed refers to a color shift amount when the color shift at the front is largest in a viewing angle range of 0° to 50°, with the viewing angle in visual recognition at the front being defined as 0°. Incidentally, the color shift amount $\delta_\theta$ when the viewing angle is θ is calculated using Equation 6 below. It can be said that the smaller the viewing angle color shift amount δ, the smaller the change in color depending upon viewing angle.

$$\delta_\theta = \sqrt{(x_\theta - x_0)^2 + (y_\theta - y_0)^2} \quad \text{(Equation 6)}$$

Wherein $x_\theta$ and $y_\theta$ represent CIE chromaticity coordinates at the viewing angle of $\theta$, and $x_0$ and $y_0$ represent CIE chromaticity coordinates at a viewing angle of 0° (at the front).

Example 3

The present example corresponds to the display apparatus according to Embodiment 4. In the present example, one light-emitting pixel unit is composed of three pixels including a red light pixel, a green light pixel, and a blue light pixel. The optical path of the blue-light-emitting pixel is varied between adjacent pixel units. Therefore, in the display apparatus, the film thickness of the transparent conductive layers in red-light, green-light, and blue-light pixels is set to be 0 nm in one light-emitting pixel unit (pixel unit 1), and the film thickness of the transparent conductive layer is set to be 0 nm in red-light and green-light pixels and 110 nm in a blue-light pixel in a light-emitting pixel unit (pixel unit 2) adjacent to the one light-emitting pixel unit. That is, the optical path was adjusted by the presence and absence of the transparent conductive layer. The transparent conductive layer was formed in a thickness of 110 nm uniformly for all the light-emitting pixels by a sputtering process, a resist pattern was formed, the region of the blue-light pixel in the pixel unit 2 was covered with a mask, and the transparent conductive layer in the remaining region was removed by wet etching. Then, a hole-transporting layer was formed in common to all the light-emitting pixel units so as to have a thickness of 196 nm in a red-light pixel, 185 nm in a green-light pixel, and 127 nm in a blue-light pixel. A display apparatus was produced by following the same procedure as in Example 2 except for the above. Table 16 collectively shows the set film thicknesses of the respective layers in the present example.

TABLE 16

Film thicknesses of respective layers

| | Pixel unit 1 | | | Pixel unit 2 | | |
|---|---|---|---|---|---|---|
| | Red light pixel | Green light pixel | Blue light pixel | Red light pixel | Green light pixel | Blue light pixel |
| Transparent electrode | 34 nm | | | 34 nm | | |
| Semi-transmissive layer | 10 nm | | | 10 nm | | |
| Electron injection layer | 64 nm | | | 64 nm | | |
| Electron-transporting layer | 10 nm | | | 10 nm | | |
| Emission layer | 50 nm | 50 nm | 36 nm | 50 nm | 50 nm | 36 nm |
| Hole-transporting layer | 196 nm | 185 nm | 127 nm | 196 nm | 185 nm | 127 nm |
| Transparent conductive layer | 0 nm | | | absent | | 110 nm |
| Reflective layer | 100 nm | | | 100 nm | | |

Table 17 shows emission characteristics in front of the blue-light-emitting pixels in the pixel units 1 and 2. It can be seen from Table 17 that the emission efficiency of the blue-light pixels in the display apparatus differs for each of the pixel units. Therefore, when signal data at the same level is transmitted to the pixel units 1 and 2, a difference in lightness is generated. Therefore, in the display apparatus of the present example, a video signal to be input to each pixel unit is corrected by previously estimating a difference in emission efficiency, whereby the luminance difference in the case where the display apparatus was viewed visually from the front thereof is overcome.

Incidentally, based on the relationship of the number of pixels constituting the pixel unit, the area of each pixel in the display apparatus of the present example was enlarged by 4/3 times that in Example 2.

TABLE 17

Emission efficiency, chromaticity coordinates, half value of emission spectrum

| | Emission efficiency (cd/A) | Chromaticity coordinates | | Half value of emission spectrum |
|---|---|---|---|---|
| | | CIEx | CIEy | |
| Pixel unit 1 | 2.4 | 0.135 | 0.092 | 50 nm |
| Pixel unit 2 | 1.4 | 0.157 | 0.078 | 30 nm |
| Combined emitted light | 3.7 | 0.144 | 0.086 | 50 nm |

Figure 19:
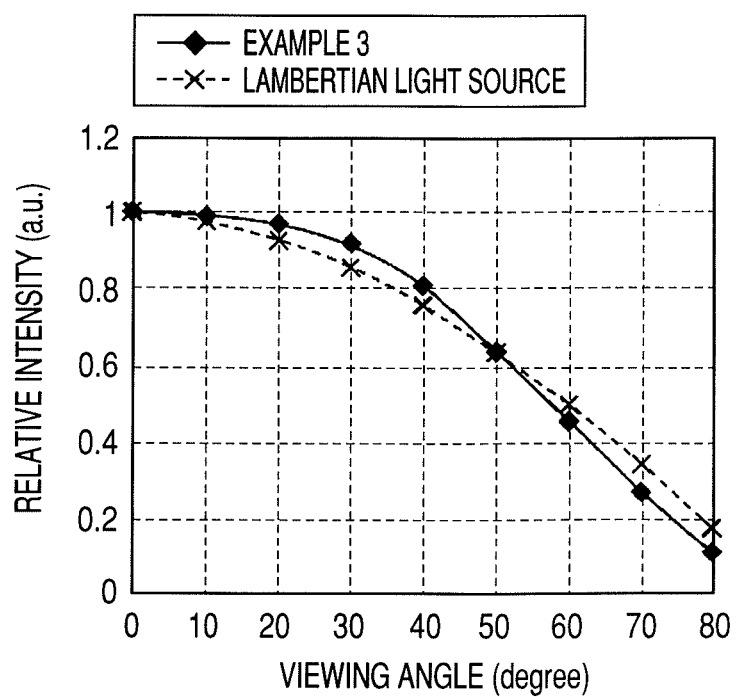
FIG. 19 is a graphical representation illustrating a viewing angle vs. relative luminance profile of a display apparatus according to Example 3.

Table 18 shows the color reproduction range (NTSC ratio) and the viewing angle color shift amount δ of the display apparatus thus obtained. Furthermore, FIG. 19 illustrates a change in relative luminance depending upon viewing angle in the case where a white color (chromaticity coordinates: 0.32, 0.33; luminance: 300 cd/m$^2$) is displayed in the display apparatus.

Comparative Example 3

Comparative Example 3 is a display apparatus in which one light-emitting pixel unit is composed of three pixels of red light, green light, and blue light pixels, and a conventional organic light-emitting device is applied to each light-emitting pixel. Based on the relationship of the number of pixels constituting the pixel unit, the aperture area of each pixel was enlarged by 4/3 times that in Example 2. Then, the conventional blue light-emitting device mentioned in Comparative Example 2 above was applied to the blue light-emitting pixel. The display apparatus was produced by following the same procedure as in Example 2, except for the above.

Figure 20:
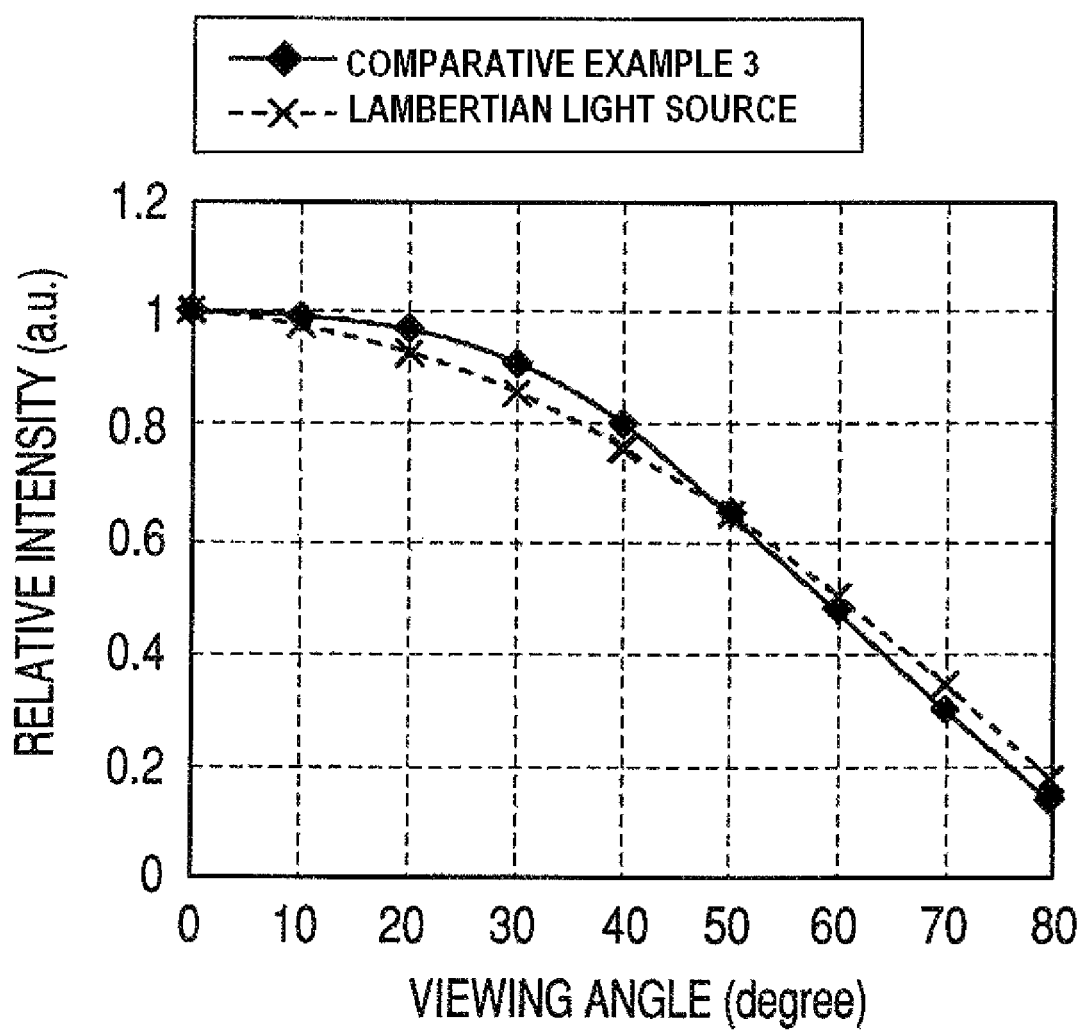
FIG. 20 is a graphical representation illustrating a viewing angle vs. relative luminance profile of a display apparatus according to Comparative Example 3.

Table 18 shows the color reproduction range (NTSC ratio) and the viewing angle color shift amount of the display apparatus thus obtained. Furthermore, FIG. 20 illustrates a change in relative luminance depending upon viewing angle in the case where a white color (chromaticity coordinates: 0.32, 0.33; luminance: 300 cd/m$^2$) is displayed in the display apparatus.

TABLE 18

Color reproduction range and viewing angle color shift amount

| | Color reproduction range (NTSC ratio) | Viewing angle color shift amount δ |
|---|---|---|
| Example 2 | 72% | 0.044 |
| Example 3 | 72% | 0.05 |
| Comparative Example 3 | 48% | 0.076 |

As can be seen from FIGS. 18, 19, and 20, the profiles of change in relative luminance depending upon viewing angle of the display apparatuses of Example 2, Example 3, and Comparative Example 3 are substantially the same as that of a Lambertian light source. Therefore, even in the case where the display apparatuses are viewed visually at a certain viewing angle, the luminance is found to be substantially the same as that in visual recognition at the front. Thus, any one of the display apparatuses can be said to have a wide viewing angle.

On the other hand, regarding the color reproducibility of the display apparatuses, it is understood from Table 18 that the color reproduction range of NTSC ratio was 72% in the display apparatuses of Examples 2 and 3, and the color reproduction range of NTSC ratio was 48% in the display apparatus of Comparative Example 3. Therefore, it can be seen that the display apparatus of the present invention has a wider color reproduction range, compared with that of the conventional display apparatus.

Further, regarding the color shift depending upon viewing angle, the color shift amount δ of viewing angle was 0.05 or less in the display apparatuses of the present invention shown in Examples 2 and 3, which is smaller than that of the conventional display apparatus (Comparative Example 3). It can be said that the change in color depending on viewing angle of the display apparatus of the present invention is small.

Accordingly, the display apparatus of the present invention has less change in luminance and color depending upon viewing angle, and has satisfactory color reproducibility. That is, the display apparatus of the present invention enables excellent color reproduction while having a wide viewing angle.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2008-046240, filed Feb. 27, 2008, and 2009-035625, filed Feb. 18, 2009 which are hereby incorporated by reference herein their entirety.

What is claimed is:

1. An organic light-emitting device disposed on a substrate, which comprises:
   a first electrode;
   an emission layer; and
   a second electrode provided in the mentioned order from the substrate side, an optical path between a first reflective surface located on the first electrode side with respect to the emission layer and a second reflective surface located on the second electrode side with respect to the emission layer being set so as to resonate light emitted in the emission layer, and which has a first region in which the optical path is relatively short and is $L_1$ and a second region in which the optical path is relatively long and is $L_2$,
   wherein $L_1$ and $L_2$ are set so as to satisfy Expression 1 with resonant wavelengths $\lambda_1$, $\lambda_2$, and $\lambda_3$, a sum $\phi t$ of phase shifts when light is reflected by the first reflective surface and the second reflective surface, and a viewing angle $\alpha$:

$$\lambda_1 = 2L_1/(p - \phi t/2\pi)$$

$$\lambda_2 = 2L_2/(q + 1 - \phi t/2\pi)$$

$$\lambda_3 = 2L_2 \cos\alpha/(q - \phi t/2\pi)$$

$$\lambda_1 = \lambda_2 = \lambda_3 \quad \text{(Expression 1)}$$

wherein p and q each independently represent a positive integer and α is not 0°.

2. The organic light-emitting device according to claim 1, wherein p represents 2 and q represents 2 in Expression 1.

3. The organic light-emitting device according to claim 1, wherein the viewing angle α satisfies 0°<|α|<60°.

4. A display apparatus comprising a plurality of pixels formed of organic light-emitting devices, wherein at least one of the organic light-emitting devices constituting the plurality of pixels is the organic light-emitting device set forth in claim 1.

5. A display apparatus comprising a plurality of pixels each comprising an organic light-emitting device disposed on a substrate, each of the organic light-emitting devices comprising:
   a first electrode;
   an emission layer; and
   a second electrode provided in the mentioned order from the substrate side, an optical path between a first reflective surface located on the first electrode side with respect to the emission layer and a second reflective surface located on the second electrode side with respect to the emission layer being set so as to resonate light emitted in the emission layer, and having a first pixel in which the optical path is relatively short and is $L_1$ and a second pixel in which the optical path is relatively long and is $L_2$,
   wherein $L_1$ and $L_2$ are set so as to satisfy Expression 2 with resonant wavelengths $\lambda_1$, $\lambda_2$, and $\lambda_3$, a sum $\phi t$ of phase shifts when light is reflected by the first reflective surface and the second reflective surface, and a viewing angle $\alpha$:

$$\lambda_1 = 2L_1/(p - \phi t/2\pi)$$

$$\lambda_2 = 2L_2/(q + 1 - \phi t/2\pi)$$

$$\lambda_3 = 2L_2 \cos\alpha/(q - \phi t/2\pi)$$

$$\lambda_1 = \lambda_2 = \lambda_3 \quad \text{(Expression 2)}$$

wherein p and q each independently represent a positive integer and α is not 0°.

6. The display apparatus according to claim 5, comprising a plurality of pixel units each having a plurality of the pixels of different emission colors, including a first pixel unit in which a pixel of at least one color of the emission colors is the first pixel and a second pixel unit in which a pixel of the one color is the second pixel.

7. The display apparatus according to claim 6, wherein the one color is a blue color.

8. The display apparatus according to claim 6, wherein the first pixel and the second pixel are adjacent to each other in adjacent pixel units.

9. The display apparatus according to claim 5, wherein in a case where the first pixel and the second pixel are allowed to emit light at the same front luminance, a value of a current supplied to the second pixel is set so as to be larger than a value of a current supplied to the first pixel.

10. The display apparatus according to claim 5, comprising a plurality of pixel units each having a plurality of the pixels having different emission colors, including a pixel unit having the first pixel and the second pixel for at least one color of the emission colors.

11. The display apparatus according to claim 10, wherein the one color is a blue color.

12. The display apparatus according to claim 5, wherein when the first and the second pixels are allowed to emit light at the same front luminance, the area of the first pixel is set to be smaller than the area of the second pixel.

* * * * *